(12) United States Patent
Takeuchi et al.

(10) Patent No.: US 6,771,676 B2
(45) Date of Patent: Aug. 3, 2004

(54) SEMICONDUCTOR LASER DEVICE AND METHOD OF FABRICATING THE SAME

(75) Inventors: Kunio Takeuchi, Joyo (JP); Shigeyuki Okamoto, Kobe (JP); Ryoji Hiroyama, Kyo-tanabe (JP); Yasuhiko Nomura, Moriguchi (JP); Daijiro Inoue, Kyoto (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/234,250

(22) Filed: Sep. 5, 2002

(65) Prior Publication Data

US 2003/0048818 A1 Mar. 13, 2003

(30) Foreign Application Priority Data

Sep. 12, 2001 (JP) ........................................ 2001-276487

(51) Int. Cl.[7] .............................................. H01S 3/04
(52) U.S. Cl. ....................................................... 372/36
(58) Field of Search ....................... 372/36, 46; 438/26, 438/46; 315/169.3

(56) References Cited

U.S. PATENT DOCUMENTS

| | | | | |
|---|---|---|---|---|
| 4,161,701 A | * | 7/1979 | Takeda et al. ................. 372/36 |
| 5,559,817 A | * | 9/1996 | Derkits et al. ................. 372/36 |
| 5,854,087 A | * | 12/1998 | Kurata ........................ 438/26 |
| 5,965,946 A | * | 10/1999 | Yano et al. .................. 257/783 |
| 6,075,800 A | * | 6/2000 | Spear .......................... 372/36 |
| 6,268,230 B1 | * | 7/2001 | Kuniyasu ...................... 438/46 |
| 6,562,648 B1 | * | 5/2003 | Wong et al. ................... 438/46 |
| 2002/0121863 A1 | * | 9/2002 | Morishita ................. 315/169.3 |

FOREIGN PATENT DOCUMENTS

| | | |
|---|---|---|
| JP | 11-145558 | 5/1999 |
| JP | 2001-189530 | 7/2001 |

* cited by examiner

*Primary Examiner*—Don Wong
*Assistant Examiner*—Hung Tran Vy
(74) *Attorney, Agent, or Firm*—McDermott Will Emery LLP

(57) ABSTRACT

A semiconductor laser device capable of improving reliability is obtained in a structure formed by mounting a semiconductor laser element on a submount (base) in a junction-down system. This semiconductor laser device comprises a first electrode layer formed on the surface of a semiconductor element including an emission layer to have a shape comprising recess portions and projection portions, a base mounted with the semiconductor element, and a plurality of low melting point metal layers provided between the first electrode layer formed on the surface of the semiconductor element and the base for bonding the first electrode layer formed on the surface of the semiconductor element and the base to each other. Thus, the plurality of low melting point metal layers easily embed clearances resulting from the shape comprising recess portions and projection portions of the surface of the semiconductor element dissimilarly to a case of employing a single low melting point metal layer.

16 Claims, 12 Drawing Sheets

SEMICONDUCTOR LASER DEVICE AND METHOD OF FABRICATING THE SAME

BACKGROUND OF THE INVENTION

1. Field of the Invention

The present invention relates to a semiconductor laser device and a method of fabricating the same, and more particularly, it relates to a semiconductor laser device formed by mounting a semiconductor laser element on a base in a junction-down system and a method of fabricating the same.

2. Description of the Background Art

A semiconductor laser device formed by mounting a semiconductor laser element on a submount (base) in a junction-down system is known in general. The junction-down system is a method of fixing a surface of the semiconductor laser element closer to an emission layer to the submount.

FIG. 17 is a sectional view showing a semiconductor laser element 100 having a plurality of ridge portions according to first prior art taken along a direction perpendicular to a cavity. The structure of the semiconductor laser element 100 having a plurality of ridge portions according to the first prior art is described with reference to FIG. 17.

In the semiconductor laser element 100 having a plurality of ridge portions according to the first prior art, an n-type buffer layer 102 of n-type GaInP having a thickness of about 0.3 μm, an n-type cladding layer 103 of n-type AlGaInP having a thickness of about 2 μm, a multiple quantum well (MQW) emission layer 104 of GaInP/AlGaInP and a p-type first cladding layer 105 of p-type AlGaInP having a thickness of about 0.3 μm are successively formed on an n-type GaAs substrate 101, as shown in FIG. 17.

A mesa (trapezoidal) ridge portion constituted by a p-type second cladding layer 106 of p-type AlGaInP having a thickness of about 1.2 μm and a p-type contact layer 107 of p-type GaInP having a thickness of about 0.1 μm is formed on the central portion of the p-type first cladding layer 105. This ridge portion is in the form of a stripe having a bottom portion of about 2.5 μm in width. Dummy ridge portions similar in structure to the ridge portion are formed to hold the ridge portion located at the center therebetween at prescribed intervals.

An n-type optical confinement layer 108 of n-type AlInP having a thickness of about 0.3 μm and an n-type current blocking layer 109 of n-type GaAs having a thickness of about 0.5 μm are formed to cover the upper surface of the p-type first cladding layer 105 and the upper and side surfaces of the dummy ridge portions located on the right and left sides while exposing only the upper surface of the central ridge portion. Therefore, no current flows to the dummy ridge portions. A p-type cap layer 110 of p-type GaAs having a thickness of about 3 μm is formed to cover the upper surface of the central ridge portion and the overall upper surface of the n-type current blocking layer 109.

A p-side electrode 111 consisting of a multilayer film of a Cr layer having a thickness of about 0.1 μm and an Au layer having a thickness of about 3 μm is formed on the p-type cap layer 110. The p-side electrode 111 is formed to have a shape comprising recess portions and projection portions reflecting the shapes of the ridge portion and the dummy ridge portions, while parts of the p-side electrode 111 located on the dummy ridge portions are formed on positions higher than a part of the p-side electrode 111 located on the upper surface of the central ridge portion by the thicknesses of the n-type optical confinement layer 108 and the n-type current blocking layer 109. An n-side electrode 112 consisting of a multilayer film of an Au—Ge layer having a thickness of about 0.2 μm, an Ni layer having a thickness of about 0.01 μm and an Au layer having a thickness of about 0.5 μm is formed on the back surface of the n-type GaAs substrate 101.

FIG. 18 is a sectional view showing the semiconductor laser element 100 according to the first prior art shown in FIG. 17 in a state mounted on a submount 113 in a junction-down system. Referring to FIG. 18, the semiconductor laser element 100 according to the first prior art is mounted on the submount (base) 113 set on a stem (not shown) while directing the p-side electrode 111 formed on the surface thereof downward in the junction-down system. A metal film 114 consisting of Ti, Pt and Au is formed on an aluminum nitride layer provided on the upper surface of the submount 113. A low melting point metal layer 115 of Pb—Sn 60% or Ag—Sn 95% serving as a fusing material is formed on the metal film 114.

In order to mount the semiconductor laser element 100 on the submount 113 while directing the p-side electrode 111 downward in the junction-down system, the low melting point metal layer 115 serving as the fusing material bonds (welds) projection portions of the p-side electrode 111 to the submount 113. In this case, voids 116 are formed between recess portions of the p-side electrode 111 and the low melting point metal layer 115.

FIG. 19 is a sectional view of a semiconductor laser element 120 having a single ridge portion according to second prior art taken along a direction perpendicular to a cavity. The structure of the semiconductor laser element 120 having a single ridge portion according to the second prior art is now described with reference to FIG. 19.

In the semiconductor laser element 120 having a single ridge portion according to the second prior art, an n-type buffer layer 102, an n-type cladding layer 103, an MQW emission layer 104 and a p-type first cladding layer 105 are successively formed on an n-type GaAs substrate 101, similarly to the semiconductor laser element 100 according to the first prior art shown in FIG. 17. The thicknesses and compositions of these layers 102 to 105 are similar to those of the semiconductor laser element 100 according to the first prior art shown in FIG. 17.

A mesa (trapezoidal) ridge portion consisting of a p-type second cladding layer 121 of p-type AlGaInP having a thickness of about 1.2 μm and a p-type contact layer 122 of p-type GaInP having a thickness of about 0.1 μm is formed on the p-type first cladding layer 105. This ridge portion is in the form of a stripe having a bottom portion of about 2.5 μm in width.

An n-type optical confinement layer 123 of n-type AlInP having a thickness of about 0.3 μm and an n-type current blocking layer 124 of n-type GaAs having a thickness of about 0.5 μm are formed to cover the upper surface of the p-type first cladding layer 105 while exposing only the upper surface of the ridge portion. A p-type cap layer 125 of p-type GaAs having a thickness of about 3 μm is formed to cover the upper surface of the ridge portion and the overall upper surface of the n-type current blocking layer 124.

A p-side electrode 126 consisting of a multilayer film of a Cr layer having a thickness of about 0.1 μm and an Au layer having a thickness of about 3 μm is formed on the p-type cap layer 125. The p-side electrode 126 is formed to have a shape comprising recess portions and projection portions reflecting the shape of the ridge portion. An n-side electrode 127 consisting of a multilayer film of an Au—Ge layer having a thickness of about 0.2 µm, an Ni layer having a thickness of about 0.01 µm and an Au layer having a thickness of about 0.5 µm is formed on the back surface of the n-type GaAs substrate 101.

FIG. 20 is a sectional view showing the semiconductor laser element 120 according to the second prior art shown in FIG. 19 in a state mounted on a submount 113 in the junction-down system. Referring to FIG. 20, the semiconductor laser element 120 according to the second prior art is mounted on the submount (base) 113 set on a stem (not shown) while directing the p-side electrode 126 formed on the surface thereof downward in the junction-down system. A metal film 114 consisting of Ti, Pt and Au is formed on an aluminum nitride layer provided on the upper surface of the submount 113. A low melting point metal layer 115 of Pb—Sn 60% or Ag—Sn 95% for serving as a fusing material is formed on the metal film 114.

In order to mount the semiconductor laser element 120 on the submount 113 while directing the p-side electrode 126 downward in the junction-down system, the low melting point metal layer 115 serving as the fusing material bonds (welds) projection portions of the p-side electrode 126 to the submount 113. In this case, voids 117 are formed between recess portions of the p-side electrode 126 and the low melting point metal layer 115.

FIG. 21 is a sectional view of a semiconductor laser element 130 having a non-current injection region on a cavity end surface according to third prior art taken along a direction perpendicular to the cavity. FIG. 22 is an enlarged sectional view showing a portion around the non-current injection region of the semiconductor laser element 130 according to the third prior art shown in FIG. 21 in a direction parallel to the cavity. The structure of the semiconductor laser element 130 having the non-current injection region on the cavity end surface according to the third prior art is described with reference to FIGS. 21 and 22.

In the semiconductor laser element 130 having the non-current injection region on the cavity end surface according to the third prior art, an n-type buffer layer 102, an n-type cladding layer 103, an MQW emission layer 104 and a p-type first cladding layer 105 are successively formed on an n-type GaAs substrate 101, similarly to the semiconductor laser element 100 according to the first prior art shown in FIG. 17. The thicknesses and compositions of these layers 102 to 105 are similar to those of the semiconductor laser element 100 according to the first prior art shown in FIG. 17.

A mesa (trapezoidal) ridge portion consisting of a p-type second cladding layer 121 of p-type AlGaInP having a thickness of about 1.2 µm and a p-type contact layer 122 of p-type GaInP having a thickness of about 0.1 µm is formed on the p-type first cladding layer 105. This ridge portion is in the form of a stripe having a bottom portion of about 2.5 µm in width.

An n-type optical confinement layer 131 of n-type AlInP having a thickness of about 0.3 µm is formed to cover the upper surface of the p-type first cladding layer 105 while exposing only the upper surface of the ridge portion. An n-type current blocking layer 132 of n-type GaAs having a thickness of about 0.5 µm is formed to cover substantially the overall upper surface of the n-type optical confinement layer 131 and a region (see FIG. 22) of the exposed upper surface of the ridge portion close to the cavity end surface. The non-current injection region is formed under the part of the n-type current blocking layer 132 formed on the region (see FIG. 22) of the upper surface of the ridge portion close to the cavity end surface. A p-type cap layer 133 of p-type GaAs having a thickness of about 3 µm is formed to cover the upper surfaces of the ridge portion and the n-type current blocking layer 132.

A p-side first electrode 134 consisting of a multilayer film of a Cr layer having a thickness of about 0.1 µm and an Au layer having a thickness of about 1 µm is formed on the p-type cap layer 133. A p-side second electrode 135 consisting of a multilayer film of a Pd layer having a thickness of about 0.1 µm and an Au layer having a thickness of about 2 µm is formed on a region of the p-side first electrode 134 other than the non-current injection region. The p-side second electrode 135 has a shape comprising recess portions and projection portions reflecting the shape of the ridge portion. An n-side electrode 136 consisting of a multilayer film of an Au—Ge layer having a thickness of about 0.2 µm, an Ni layer having a thickness of about 0.01 µm and an Au layer having a thickness of about 0.5 µm is formed on the back surface of the n-type GaAs substrate 101.

FIG. 23 is a sectional view showing the semiconductor laser element 130 according to the third prior art shown in FIG. 21 in a state mounted on a submount 113 in the junction-down system. Referring to FIG. 23, the semiconductor laser element 130 according to the third prior art is mounted on the submount (base) 113 set on a stem (not shown) while directing the p-side second electrode 135 formed on the surface thereof downward in the junction-down system. A metal film 114 consisting of Ti, Pt and Au is formed on an aluminum nitride layer provided on the upper surface of the submount 113. A low melting point metal layer 115 of Pb—Sn 60% or Ag—Sn 95% for serving as a fusing material is formed on the metal film 114.

In order to mount the semiconductor laser element 130 on the submount 113 while directing the p-side second electrode 135 downward in the junction-down system, the low melting point metal layer 115 serving as the fusing material bonds (welds) projection portions of the p-side second electrode 135 to the submount 113. In this case, voids 118 are formed between regions of the p-side second electrode 135 other than projection portions and the low melting point metal layer 115.

In a semiconductor laser device fabricated by mounting the semiconductor laser element 100, 120 or 130 according to the first, second or third prior art on the submount 113 in the junction-down system, as hereinabove described, the low melting point metal layer 115 provided on the submount 113 for serving as the fusing material bonds the semiconductor laser element 100, 120 or 130 to the submount 113. In general, the submount 113 also serves as a heat sink absorbing heat of the semiconductor laser element 100, 120 or 130 and radiating the same outward.

In the semiconductor laser device fabricated by bonding the semiconductor laser element 100 according to the aforementioned first prior art to the submount 113 in the junction-down system, however, heat radiation as well as bond strength are disadvantageously reduced due to the voids 116 formed between the recess portions of the p-side electrode 111 and the low melting point metal layer 115, as shown in FIG. 18. Therefore, the semiconductor laser device having the semiconductor laser element 100 according to the first prior art is disadvantageously reduced in reliability.

In the semiconductor laser device fabricated by bonding the semiconductor laser element 120 or 130 according to the aforementioned second or third prior art to the submount 113 in the junction-down system, only the projection portions of the p-side electrode 126 or the p-side second electrode 135 come into contact with the metal film 114 formed on the submount 113 as shown in FIG. 20 or 23, and hence stress is disadvantageously applied to the ridge portion located under the projection portions of the p-side electrode 126 or the p-side second electrode 135. Consequently, operating current and operating voltage may be increased due to the stress. Further, the voids 117 or 118 are formed between the regions of the p-side electrode 126 or the p-side second electrode 135 other than the projection portions and the low melting point metal layer 115, and hence heat radiation as well as bond strength are disadvantageously reduced. When the bond strength is reduced, the semiconductor laser element 120 or 130 tends to incline when mounted on the submount 113. Thus, the semiconductor laser device having the semiconductor laser element 120 or 130 according to the second or third prior art is disadvantageously reduced in reliability.

SUMMARY OF THE INVENTION

An object of the present invention is to provide a semiconductor laser device capable of improving reliability in a structure obtained by mounting a semiconductor laser element on a submount (base) in a junction-down system.

Another object of the present invention is to improve heat radiation and bond strength in the aforementioned semiconductor laser device.

Still another object of the present invention is to prevent operating current and operating voltage from increase resulting from stress applied to a ridge portion in the aforementioned semiconductor laser device.

A further object of the present invention is to provide a method of fabricating a semiconductor laser device capable of improving reliability in a structure obtained by mounting a semiconductor laser element on a submount (base) in a junction-down system.

In order to attain the aforementioned objects, a semiconductor laser device according to a first aspect of the present invention comprises a first electrode layer formed on the surface of a semiconductor element including an emission layer to have a shape comprising recess portions and projection portions, a base mounted with the semiconductor element, and a plurality of low melting point metal layers provided between the first electrode layer formed on the surface of the semiconductor element and the base for bonding the first electrode layer formed on the surface of the semiconductor element and the base to each other.

The semiconductor laser device according to the first aspect is provided with the plurality of low melting point metal layers for bonding the first electrode layer formed on the surface of the semiconductor element and the base to each other as hereinabove described, whereby the plurality of low melting point metal layers easily embed clearances resulting from the shape, comprising recess portions and projection portions, of the surface of the semiconductor element located on the bonded surfaces of the first electrode layer formed on the surface of the semiconductor element and the base, dissimilarly to a case of employing a single low melting point metal layer. Therefore, excellent heat radiation can be attained while bond strength can be improved. Thus, the bond strength can be so improved that the semiconductor element can be stably mounted on the base with no inclination. When the low melting point metal layers are prepared from a soft material, the plurality of low melting point metal layers prepared from the soft material can embed a ridge portion provided on a semiconductor laser element, thereby effectively relaxing stress applied to the ridge portion. Consequently, operating current and operating voltage can be prevented from increase resulting from stress, whereby the semiconductor laser device can attain excellent reliability.

In the aforementioned semiconductor laser device according to the first aspect, the plurality of low melting point metal layers are preferably formed to bond the first electrode layer formed on the surface of the semiconductor element and the base to each other while embedding the shape comprising recess portions and projection portions. According to this structure, excellent heat radiation can be easily attained and bond strength can be improved.

In the aforementioned semiconductor laser device according to the first aspect, the plurality of low melting point metal layers preferably have a thickness exceeding the height of the projection portions of the shape comprising recess portions and projection portions, i.e., a thickness exceeding the difference between the height of the bottom surfaces of the recess portions and the top surfaces of the projection portions. According to this structure, the plurality of low melting point metal layers can easily embed the shape comprising recess portions and projection portions.

A semiconductor laser device according to a second aspect of the present invention comprises a first electrode layer formed on the surface of a semiconductor element including an emission layer to have a shape comprising recess portions and projection portions, a base mounted with the semiconductor element, and a low melting point metal layer provided between the first electrode layer formed on the surface of the semiconductor element and the base and formed on a portion for bonding the first electrode layer formed on the surface of the semiconductor element and the base to each other to embed the shape comprising recess portions and projection portions.

The semiconductor laser device according to the second aspect is provided with the low melting point metal layer on the portion bonding the first electrode layer formed on the surface of the semiconductor element and the base to each other to embed the shape comprising recess portions and projection portions as hereinabove described, whereby excellent heat radiation can be attained while bond strength can be improved. Thus, the bond strength can be so improved that the semiconductor element can be stably mounted on the base with no inclination. When the low melting point metal layer is prepared from a soft material, the low melting point metal layer prepared from the soft material can embed a ridge portion provided on a semiconductor laser element, thereby effectively relaxing stress applied to the ridge portion. Consequently, operating current and operating voltage can be prevented from increase resulting from stress, whereby the semiconductor laser device can attain excellent reliability.

In the aforementioned semiconductor laser device according to each of the first and second aspects, the low melting point metal layer(s) preferably include(s) a first low melting point metal layer provided on the first electrode layer formed on the semiconductor element, and a second low melting point metal layer provided on the base. According to this structure, the first low melting point metal layer is so melted as to embed the shape, comprising recess portions and projection portions, of the first electrode layer formed on the surface of the semiconductor element, so that excellent heat radiation can be attained and bond strength can be improved. In this case, the first low melting point metal layer may include at least either an Sn layer or an Au—Sn layer, and the second low melting point metal layer may include at least any of a Pb—Sn layer, an Ag—Sn layer and an Au—Sn layer. Further, the first low melting point metal layer may include a multilayer film having a plurality of Au—Sn layers of different Au—Sn compositions.

In the aforementioned semiconductor laser device according to each of the first and second aspects, the first electrode layer preferably includes a first electrode layer provided on the surface of the semiconductor element, a second electrode layer is preferably further provided on the surface of the semiconductor element, and the low melting point metal layer(s) preferably bond(s) the first electrode layer and the second electrode layer to the base. According to this structure, bond strength between the second electrode layer and the base can also be easily improved.

In the aforementioned semiconductor laser device according to each of the first and second embodiments, the semiconductor element including the emission layer is preferably formed on a first conductivity type GaN substrate. According to this structure, the semiconductor element including the emission layer having excellent crystallinity can be formed on the GaN substrate.

In the aforementioned semiconductor laser device according to each of the first and second aspects, the surface of the semiconductor element closer to the emission layer is preferably mounted on the base. According to this structure of junction-down assembly, heat generated from the emission layer can be excellently radiated toward the base.

A semiconductor laser device according to a third aspect of the present invention comprises a first electrode layer formed on the surface of a semiconductor element including an emission layer to have a shape comprising recess portions and projection portions, a base mounted with the semiconductor element, and a plurality of low melting point metal layers provided between the first electrode layer formed on the surface of the semiconductor element and the base for bonding the first electrode layer formed on the surface of the semiconductor element and the base to each other, and the low melting point metal layers include a first low melting point metal layer provided on the first electrode layer formed on the surface of the semiconductor element and a second low melting point metal layer provided on the base.

The semiconductor laser device according to the third aspect is provided with the first low melting point metal layer and the second low melting point metal layer for bonding the first electrode layer formed on the surface of the semiconductor element and the base to each other as hereinabove described, whereby the first and second low melting point metal layers can easily embed clearances resulting from the shape comprising recess portions and projection portions on the surface of the semiconductor element located on the bonded surfaces of the first electrode layer formed on the surface of the semiconductor element and the base, dissimilarly to a case of employing a single low melting point metal layer. Therefore, excellent heat radiation can be attained and bond strength can be improved. Thus, the bond strength can be so improved that the semiconductor element can be stably mounted on the base with no inclination. When the low melting point metal layers are prepared from a soft material, the low melting point metal layers prepared from the soft material can embed a ridge portion provided on a semiconductor laser element, thereby effectively relaxing stress applied to the ridge portion. Consequently, operating current and operating voltage can be prevented from increase resulting from stress, whereby the semiconductor laser device can attain excellent reliability.

A method of fabricating a semiconductor laser device according to a fourth aspect of the present invention comprises steps of forming a first low melting point metal layer on a first electrode layer formed on the surface of a semiconductor element including an emission layer to have a shape comprising recess portions and projection portions, forming a second low melting point metal layer on a base mounted with the semiconductor element, and heating the first low melting point metal layer and the second low melting point metal layer in an opposed state thereby melting the first low melting point metal layer and the second low melting point metal layer and bonding the first electrode layer formed on the surface of the semiconductor element and the base to each other.

In the method of fabricating a semiconductor laser device according to the fourth aspect, the first low melting point metal layer formed on the first electrode layer and the second low melting point metal layer formed on the base are melted for bonding the first electrode layer formed on the surface of the semiconductor element and the base to each other as hereinabove described, whereby the first and second low melting point metal layers easily embed clearances resulting from the shape comprising recess portions and projection portions on the surface of the semiconductor element located on the bonded surfaces of the first electrode layer formed on the surface of the semiconductor element and the base, dissimilarly to a case of employing a single low melting point metal layer. Therefore, excellent heat radiation can be attained and bond strength can be improved. Thus, the bond strength can be so improved that the semiconductor element can be stably mounted on the base with no inclination. When the low melting point metal layers are prepared from a soft material, the low melting point metal layers prepared from the soft material can embed a ridge portion provided on a semiconductor laser element, thereby effectively relaxing stress applied to the ridge portion. Consequently, operating current and operating voltage can be prevented from increase resulting from stress, whereby a semiconductor laser device having excellent reliability can be formed.

In the aforementioned method of fabricating a semiconductor laser device according to the fourth aspect, the step of bonding the first electrode layer formed on the surface of the semiconductor element and the base to each other preferably includes a step of melting the plurality of low melting point metal layers for embedding the shape comprising recess portions and projection portions thereby bonding the first electrode layer formed on the surface of the semiconductor element and the base to each other. According to this structure, excellent heat radiation can be easily attained and bond strength can be improved.

In the aforementioned method of fabricating a semiconductor laser device according to the fourth aspect, the step of bonding the first electrode layer formed on the surface of the semiconductor element and the base to each other preferably includes a step of bonding the surface of the semiconductor element closer to the emission layer to the base. According to this structure of junction-down assembly, heat generated from the emission layer can be excellently radiated toward the base.

In the aforementioned method of fabricating a semiconductor laser device according to the fourth aspect, the first low melting point metal layer may include at least either an Sn layer or an Au—Sn layer, and the second low melting point metal layer may include at least any of a Pb—Sn layer, an Ag—Sn layer and an Au—Sn layer. Further, the step of forming the first low melting point metal layer may include a step of forming a multilayer film including a plurality of Au—Sn layers having different Au—Sn compositions.

The aforementioned method of fabricating a semiconductor laser device according to the fourth aspect preferably further comprises a step of forming the semiconductor element including the emission layer on a first conductivity type GaN substrate in advance of the step of forming the first low melting point metal layer. According to this structure, the semiconductor element including the emission layer having excellent crystallinity can be formed on the GaN substrate.

A method of fabricating a semiconductor laser device according to a fifth aspect of the present invention comprises steps of forming a first electrode layer having a shape comprising recess portions and projection portions on a surface of a semiconductor element including an emission layer and having a shape comprising recess portions and projection portions at the surface, preparing a base mounted with the semiconductor element, and melting a low melting point metal layer to embed the shape, comprising recess portions and projection portions, of the first electrode layer while opposing the base mounted with the semiconductor element and the first electrode layer formed on the surface of the semiconductor element thereby bonding the first electrode layer formed on the surface of the semiconductor element and the base to each other.

In the method of fabricating a semiconductor laser device according to the fifth aspect, the low melting point metal layer is melted for bonding the first electrode layer formed on the surface of the semiconductor element and the base to each other to embed the shape, comprising recess portions and projection portions, of the first electrode layer, whereby excellent heat radiation can be attained and bond strength can be improved. Thus, the bond strength can be so improved that the semiconductor element can be stably mounted on the base with no inclination. When the low melting point metal layer is prepared from a soft material, the low melting point metal layer prepared from the soft material can embed a ridge portion provided on a semiconductor laser element, thereby effectively relaxing stress applied to the ridge portion. Consequently, operating current and operating voltage can be prevented from increase resulting from stress, whereby a semiconductor laser device having excellent reliability can be formed.

The aforementioned method of fabricating a semiconductor laser device according to the fifth aspect preferably further comprises a step of forming the semiconductor element including the emission layer on a first conductivity type GaN substrate in advance of the step of forming the first electrode layer. According to this structure, the semiconductor element including the emission layer having excellent crystallinity can be formed on the GaN substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

A first embodiment of the present invention is applied to a semiconductor laser element 150 having a plurality of ridge portions.

Figure 1:
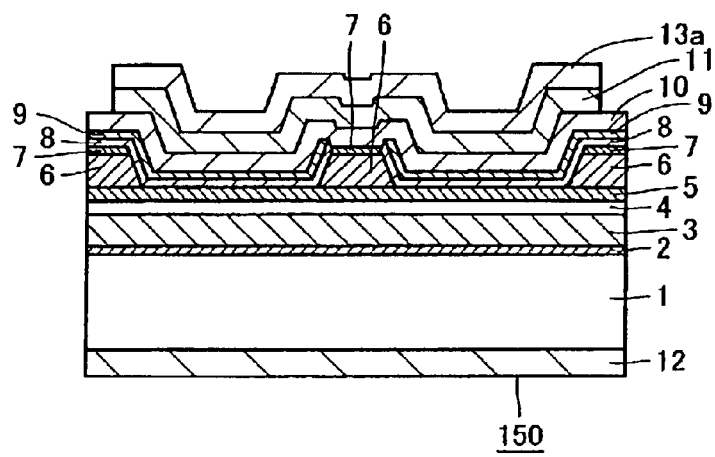
FIG. 1 is a sectional view showing a semiconductor laser element according to a first embodiment of the present invention in a direction perpendicular to a cavity.

The structure of the semiconductor laser element 150 according to the first embodiment of the present invention is now described with reference to FIG. 1. In the semiconductor laser element 150 according to the first embodiment, an n-type buffer layer 2 of n-type GaInP having a thickness of about 0.3 μm, an n-type cladding layer 3 of n-type AlGaInP having a thickness of about 2 μm, a multiple quantum well (MQW) emission layer 4 of GaInP and AlGaInP and a p-type first cladding layer 5 of p-type AlGaInP having a thickness of about 0.3 μm are formed on an n-type GaAs substrate 1. The MQW emission layer 4 is an example of the "emission layer" according to the present invention.

A mesa (trapezoidal) ridge portion and dummy ridge portions each consisting of a p-type second cladding layer 6 of p-type AlGaInP having a thickness of about 1.2 μm and a p-type contact layer 7 of p-type GaInP having a thickness of about 0.1 μm are formed on the upper surface of the p-type first cladding layer 5. The ridge portion and the dummy ridge portions are formed to have a height of about 1.3 μm so that the widths of the bottom portions of the ridge portion and the dummy ridge portions are about 2.5 μm and about 20 μm respectively. An n-type optical confinement layer 8 of n-type AlInP having a thickness of about 0.3 μtm and an n-type current blocking layer 9 of n-type GaAs having a thickness of about 0.5 μm are formed to cover the upper surface of the p-type first cladding layer 5, the side surfaces of the ridge portion and the dummy ridge portions and the upper surfaces of the dummy ridge portions. The n-type optical confinement layer 8 and the n-type current blocking layer 9 are formed to cover the upper surfaces of the dummy ridge portions, whereby no current flows to the dummy ridge portions. The n-type optical confinement layer 8 and the n-type current blocking layer 9 are formed to protrude upward beyond the upper surface of the central ridge portion.

A p-type cap layer 10 of p-type GaAs having a thickness of about 3 μm is formed to cover the exposed upper surface of the ridge portion and the upper surface of the n-type current blocking layer 9. A p-side electrode 11 consisting of a multilayer film of a Cr layer having a thickness of about 0.1 μm and an Au layer having a thickness of about 3 μm is formed on a prescribed region of the upper surface of the p-type cap layer 10. A part of the p-side electrode 11 located on the central ridge portion is formed to have a shape comprising recess portions and projection portions reflecting the shapes of the n-type optical confinement layer 8 and the n-type current blocking layer 9 protruding upward beyond the upper surface of the central ridge portion. In the p-side electrode 11 formed also in a shape comprising recess portions and projection portions reflecting the shapes of the ridge portion and the dummy ridge portions, parts located on the dummy ridge portions are formed on positions higher than the part located on the upper surface of the central ridge portion by the thicknesses of the n-type optical confinement layer 8 and the n-type current blocking layer 9. The p-side electrode 11 is an example of the "first electrode layer" according to the present invention.

An n-side electrode 12 consisting of a multilayer film of an Au—Ge layer having a thickness of about 0.2 μm, an Ni layer having a thickness of about 0.01 μm and an Au layer having a thickness of about 0.5 μm is formed on the back surface of the n-type GaAs substrate 1.

A low melting point metal layer 13a consisting of an Au—Sn 20% layer having a thickness of about 0.3 μm and an Au—Sn 90% layer having a thickness of about 0.6 μm for serving as a fusing material is formed on the p-side electrode 11. An Au film (not shown) having a thickness of about 0.01 μm is formed on the low melting point metal layer 13a for preventing oxidation. The low melting point metal layer 13a is an example of the "first low melting point metal layer" according to the present invention.

A process of forming the semiconductor laser element 150 according to the first embodiment having the aforementioned structure is now described with reference to FIG. 1. First, the n-type buffer layer 2 of n-type GaInP having the thickness of about 0.3 μm, the n-type cladding layer 3 of n-type AlGaInP having the thickness of about 2 μm, the multiple quantum well (MQW) emission layer 4 of GaInP and AlGaInP, the p-type first cladding layer 5 of p-type AlGaInP having the thickness of about 0.3 μm, the p-type second cladding layer 6 of p-type AlGaInP having the thickness of about 1.2 μm and the p-type contact layer 7 of p-type GaInP having the thickness of about 0.1 μm are successively formed on the n-type GaAs substrate 1 by MOVPE (metal organic vapor phase epitaxy).

Then, the mesa (trapezoidal) ridge portion and the dummy ridge portions each consisting of the p-type second cladding layer 6 and the p-type contact layer 7 are formed by photolithography and etching. The ridge portion and the dummy ridge portions are formed to have the height of about 1.3 μm while the widths of the bottom portions of the ridge portion and the dummy ridge portions are about 2.5 μm and about 20 μm respectively.

Then, a mask layer (not shown) of SiO$_2$ formed on the central ridge portion is employed as a mask for growing the n-type optical confinement layer 8 of n-type AlInP having the thickness of about 0.3 μm and the n-type current blocking layer 9 of n-type GaAs having the thickness of about 0.5 μm by MOVPE to cover the upper surface of the p-type first cladding layer 5, the side surfaces of the ridge portion and the upper surfaces of the dummy ridge portions other than the central ridge portion. The n-type optical confinement layer 8 and the n-type current blocking layer 9 are formed to cover the upper surfaces of the dummy ridge portions, whereby no current flows to the dummy ridge portions. Thereafter the mask layer (not shown) of SiO$_2$ formed on the central ridge portion is removed. In this case, the n-type optical confinement layer 8 and the n-type current blocking layer 9, formed also on the side surfaces of the mask layer (not shown) of SiO$_2$, protrude upward beyond the upper surface of the central ridge portion after removal of the mask layer (not shown) of SiO$_2$.

Thereafter the p-type cap layer 10 of p-type GaAs having the thickness of about 3 μm is formed by MOVPE to cover the exposed upper surface of the ridge portion and the upper surface of the n-type current blocking layer 9. Then, the p-side electrode 11 consisting of the multilayer film of the Cr layer having the thickness of about 0.1 μm and the Au layer having the thickness of about 3 μm is formed on the p-type cap layer 10 by a lift off method. The part of the p-side electrode 11 located on the central ridge portion is formed to have the shape comprising recess portions and projection portions reflecting the shapes of the n-type optical confinement layer 8 and the n-type current blocking layer 9 protruding upward beyond the upper surface of the central ridge portion. In the p-side electrode 11 formed also in the shape comprising recess portions and projection portions reflecting the shapes of the ridge portion and the dummy ridge portions, the parts located on the dummy ridge portions are formed on the positions higher than the part located on the upper surface of the central ridge portion by the thicknesses of the n-type optical confinement layer 8 and the n-type current blocking layer 9.

The back surface of the n-type GaAs substrate 1 is etched so that the thickness of the n-type GaAs substrate 1 is about 100 μm, for thereafter forming the n-side electrode 12 consisting of the multilayer film of the Au—Ge layer having the thickness of about 0.2 μm, the Ni layer having the thickness of about 0.01 μm and the Au layer having the thickness of about 0.5 μm on the back surface of the n-type GaAs substrate 1 by vacuum deposition. Thereafter heat treatment is performed with inert gas at a temperature of about 430° C. for about 5 minutes, thereby attaining ohmic contact.

Thereafter the Au—Sn 20% layer having the thickness of about 0.3 μm and the Au—Sn 90% layer having the thickness of about 0.6 μm are deposited on the p-side electrode 11 by the lift off method in the first embodiment, thereby forming the low melting point metal layer 13a consisting of Au—Sn 20% and Au—Sn 90% for serving as the fusing material. The Au film (not shown) having the thickness of about 0.01 μm is formed on the low melting point metal layer 13a for preventing oxidation.

A process of mounting the semiconductor laser element 150 according to the first embodiment on a submount 14 is now described with reference to FIGS. 2 and 3.

Figure 2:
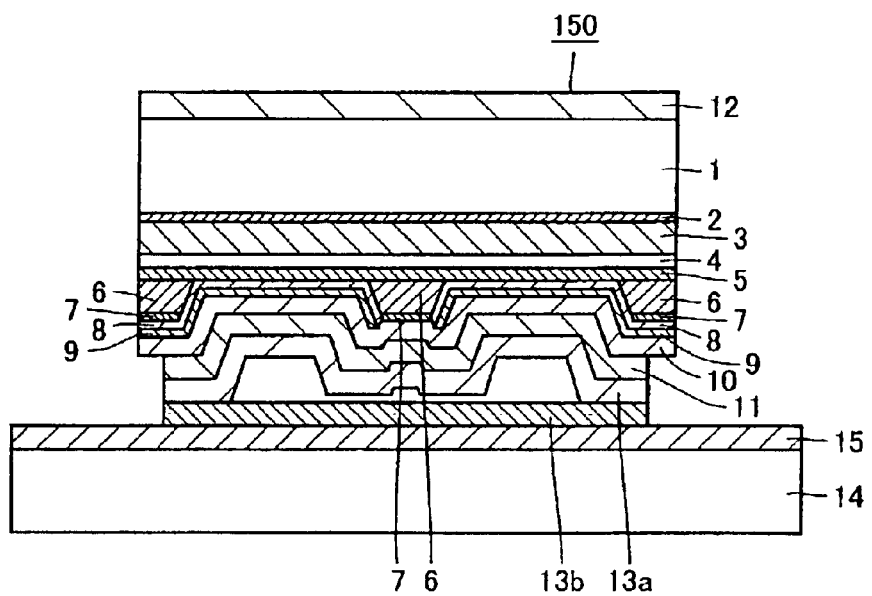
FIGS. 2 and 3 are sectional views for illustrating a process of mounting the semiconductor laser element shown in FIG. 1 on a submount (base) in a junction-down system.
Figure 3:
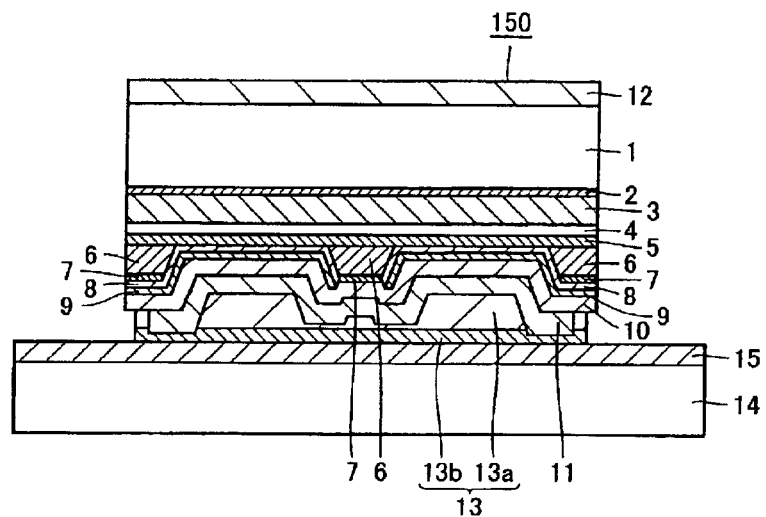

As shown in FIG. 2, a metal film 15 consisting of Ti, Pt and Au is formed on an aluminum nitride layer provided on the upper surface of the submount (base) 14, and a low melting point metal layer 13b of Pb—Sn 60% or Ag—Sn 95% for serving as a fusing material is previously formed on the metal film 15. The low melting point metal layer 13b is an example of the "second low melting point metal layer" according to the present invention.

The p-side electrode 11 formed on the surface of the semiconductor laser element 150 is directed downward as shown in FIG. 2, for oppositely bringing the low melting point metal layers 13a and 13b of the semiconductor laser element 150 and the submount 14 into contact with each other. In this state, the low melting point metal layers 13a and 13b are heated to about 200° C. to about 300° C., to be melted. A low melting point metal layer 13 consisting of the melted low melting point metal layers 13a and 13b bonds (welds) the semiconductor laser element 150 to the submount 14, as shown in FIG. 3. In this case, the low melting point metal layer 13a embeds the shape, comprising recess portions and projection portions, of the p-side electrode 11, so that the low melting point metal layer 13 (the low melting point metal layers 13a and 13b) embeds the space between the p-side electrode 11 and the submount 14 with no clearance.

According to the first embodiment, the low melting point metal layers 13a and 13b formed on the p-side electrode 11 and the submount 14 respectively are melted to bond the p-side electrode 11 of the semiconductor laser element 150 and the submount 14 to each other, whereby the low melting point metal layers 13a and 13b can embed a clearance resulting from the shape, comprising recess portions and projection portions, of the p-side electrode 11 formed on the surface of the semiconductor laser element 150. Thus, excellent heat radiation can be attained and bond strength can be improved. Consequently, a semiconductor laser device having excellent reliability can be formed.

Second Embodiment

A second embodiment of the present invention is applied to a semiconductor laser element 151 having a single ridge portion.

Figure 4:
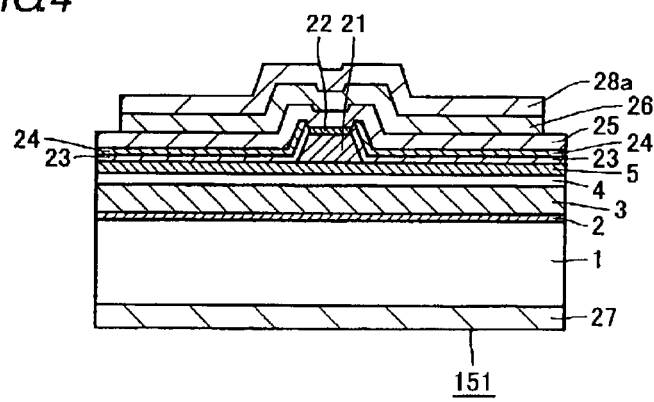
FIG. 4 is a sectional view showing a semiconductor laser element according to a second embodiment of the present invention in a direction perpendicular to a cavity.

The structure of the semiconductor laser element 151 according to the second embodiment of the present invention is now described with reference to FIG. 4. In the semiconductor laser element 151 according to the second embodiment, an n-type buffer layer 2, an n-type cladding layer 3, an MQW emission layer 4 and a p-type first cladding layer 5 are formed on an n-type GaAs substrate 1, similarly to the semiconductor laser element 150 according to the first embodiment shown in FIG. 1. The compositions and thicknesses of the layers 2 to 5 are similar to those of the layers 2 to 5 in the first embodiment.

A mesa (trapezoidal) ridge portion consisting of a p-type second cladding layer 21 of p-type AlGaInP having a thickness of about 1.2 μm and a p-type contact layer 22 of p-type GaInP having a thickness of about 0.1 μm is formed on the upper surface of the p-type first cladding layer 5. The ridge portion is formed to have a height of about 1.3 μm while the width of the bottom portion thereof is about 2.5 μm. An n-type optical confinement layer 23 of n-type AlInP having a thickness of about 0.3 μm and an n-type current blocking layer 24 of n-type GaAs having a thickness of about 0.5 μm are formed to cover the upper surface of the p-type first cladding layer 5 and the side surfaces of the ridge portion. The n-type optical confinement layer 23 and the n-type current blocking layer 24 are formed to protrude upward beyond the upper surface of the ridge portion.

A p-type cap layer 25 of p-type GaAs having a thickness of about 3 μm is formed to cover the exposed upper surface of the ridge portion and the upper surface of the n-type current blocking layer 24. A p-side electrode 26 consisting of a multilayer film of a Cr layer having a thickness of about 0.1 μm and an Au layer having a thickness of about 3 μm is formed on a prescribed region of the upper surface of the p-type cap layer 25. A part of the p-side electrode 26 located on the ridge portion is formed to have a shape comprising recess portions and projection portions reflecting the shapes of the n-type optical confinement layer 23 and the n-type current blocking layer 24 protruding upward beyond the upper surface of the ridge portion. The p-side electrode 26 is formed also in a shape comprising recess portions and projection portions reflecting the shape of the ridge portion. The p-side electrode 26 is an example of the "first electrode layer" according to the present invention.

An n-side electrode 27 consisting of a multilayer film of an Au—Ge layer having a thickness of about 0.2 μm, an Ni layer having a thickness of about 0.01 μm and an Au layer having a thickness of about 0.5 μm is formed on the back surface of the n-type GaAs substrate 1.

A low melting point metal layer 28a consisting of an Au—Sn 20% layer having a thickness of about 0.3 μm and an Au—Sn 90% layer having a thickness of about 0.6 μm for serving as a fusing material is formed on the p-side electrode 26. An Au film (not shown) having a thickness of about 0.01 μm is formed on the low melting point metal layer 28a for preventing oxidation. The low melting point metal layer 28a is an example of the "first low melting point metal layer" according to the present invention.

A process of forming the semiconductor laser element 151 according to the second embodiment is now described with reference to FIG. 4. First, the n-type buffer layer 2 of n-type GaInP, the n-type cladding layer 3, the MQW emission layer 4 and the p-type first cladding layer 5 are formed on the n-type GaAs substrate 1 through a process similar to that of the first embodiment shown in FIG. 1. The compositions and thicknesses of the layers 2 to 5 are similar to those of the layers 2 to 5 in the first embodiment. Then, the p-type second cladding layer 21 of p-type AlGaInP having the thickness of about 1.2 μm and the p-type contact layer 22 of p-type GaInP having the thickness of about 0.1 μm are successively formed on the p-type first cladding layer 5.

Then, the mesa (trapezoidal) ridge portion consisting of the p-type second cladding layer 21 and the p-type contact layer 22 is formed by photolithography and etching. The ridge portion is formed to have the height of about 1.3 μm while the width of the bottom portion thereof is about 2.5 μm.

Then, a mask layer (not shown) of $SiO_2$ formed on the ridge portion is employed as a mask for growing the n-type optical confinement layer 23 of n-type AlInP having the thickness of about 0.3 μm and the n-type current blocking layer 24 of n-type GaAs having the thickness of about 0.5 μm by MOVPE to cover the upper surface of the p-type first cladding layer 5 and the side surfaces of the ridge portion. Thereafter the mask layer (not shown) is removed from the ridge portion. In this case, the n-type optical confinement layer 23 and the n-type current blocking layer 24, formed also on the side surfaces of the mask layer (not shown) of $SiO_2$, protrude upward beyond the upper surface of the ridge portion after removal of the mask layer (not shown).

Thereafter the p-type cap layer 25 of p-type GaAs having the thickness of about 3 μm is formed by MOVPE to cover the exposed upper surface of the ridge portion and the upper surface of the n-type current blocking layer 24. Then, the p-side electrode 26 consisting of the multilayer film of the Cr layer having the thickness of about 0.1 μm and the Au layer having the thickness of about 3 μm is formed on the p-type cap layer 25 by the lift off method. The p-side electrode 26 is formed to have the shape comprising recess portions and projection portions reflecting the shapes of the n-type optical confinement layer 23 and the n-type current blocking layer 24 protruding upward beyond the upper surface of the ridge portion.

The back surface of the n-type GaAs substrate 1 is etched so that the thickness of the n-type GaAs substrate 1 is about 100 μm, for thereafter forming the n-side electrode 27 consisting of the multilayer film of the Au—Ge layer having the thickness of about 0.2 μm, the Ni layer having the thickness of about 0.01 μm and the Au layer having the thickness of about 0.5 μm on the back surface of the n-type GaAs substrate 1 by vacuum deposition. Thereafter heat treatment is performed with inert gas at a temperature of about 430° C. for about 5 minutes, thereby attaining ohmic contact.

Thereafter the Au—Sn 20% layer having the thickness of about 0.3 μm and the Au—Sn 90% layer having the thickness of about 0.6 μm are deposited on the p-side electrode 26 by the lift off method in the second embodiment, thereby forming the low melting point metal layer 28a consisting of Au—Sn 20% and Au—Sn 90% for serving as the fusing material. The Au film (not shown) having the thickness of about 0.01 μm is formed on the low melting point metal layer 28a for preventing oxidation.

A process of mounting the semiconductor laser element 151 according to the second embodiment on a submount 14 is now described with reference to FIGS. 5 and 6.

Figure 5:
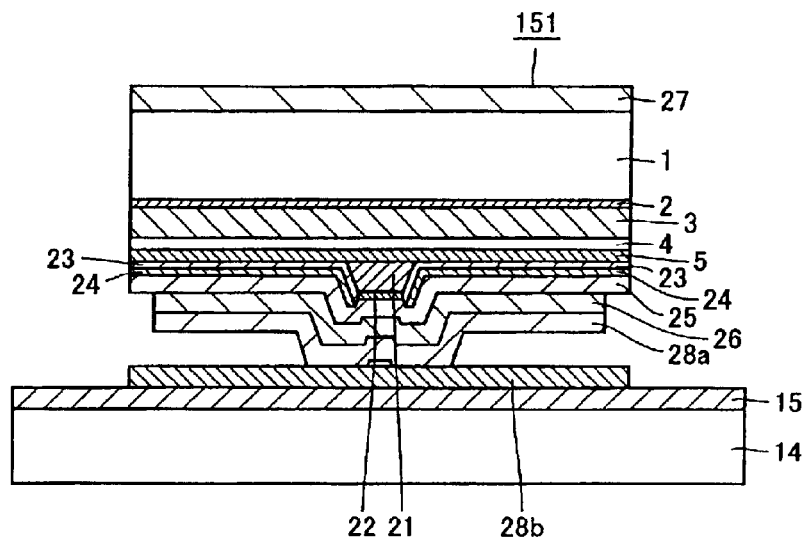
FIGS. 5 and 6 are sectional views for illustrating a process of mounting the semiconductor laser element shown in FIG. 4 on a submount (base) in the junction-down system.
Figure 6:
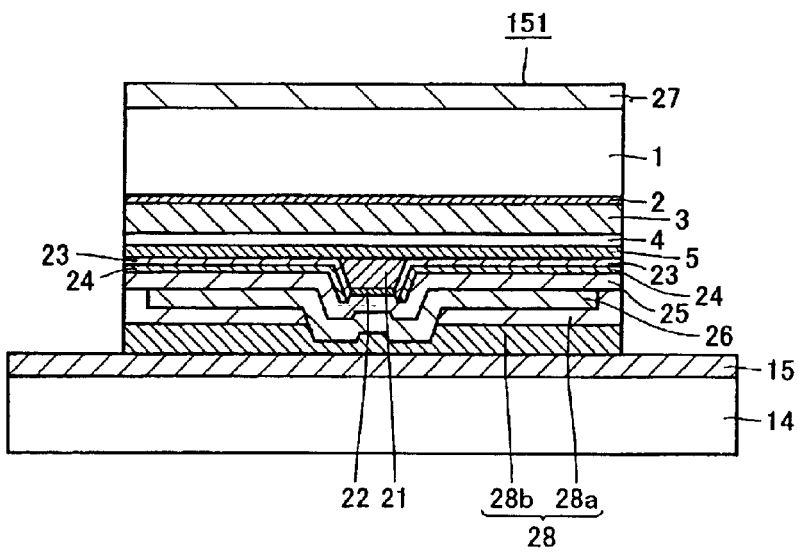

As shown in FIG. 5, a metal film 15 consisting of Ti, Pt and Au is formed on an aluminum nitride layer provided on the upper surface of the submount (base) 14, and a low melting point metal layer 28b of Pb—Sn 60% or Ag—Sn 95% for serving as a fusing material is previously formed on the metal film 15. The low melting point metal layer 28b is an example of the "second low melting point metal layer" according to the present invention.

The p-side electrode 26 formed on the surface of the semiconductor laser element 151 is directed downward as shown in FIG. 5, for oppositely bringing the low melting point metal layers 28a and 28b of the semiconductor laser element 151 and the submount 14 into contact with each other. In this state, the low melting point metal layers 28a and 28b are heated to about 200° C. to about 300° C., to be melted. A low melting point metal layer 28 consisting of the melted low melting point metal layers 28a and 28b bonds (welds) the semiconductor laser element 151 to the submount 14, as shown in FIG. 6. In this case, the low melting point metal layer 28a embeds the shape, comprising recess portions and projection portions, of the p-side electrode 26, so that the low melting point metal layer 28 (the low melting point metal layers 28a and 28b) embeds the space between the p-side electrode 26 and the submount 14 with no clearance. Therefore, the semiconductor laser element 151 is mounted on the submount 14 in the junction-down system so that a projection portion of the p-side electrode 26 and the metal film 15 formed on the submount 14 are not in contact with each other.

According to the second embodiment, the low melting point metal layers 28a and 28b formed on the p-side electrode 26 and the submount 14 respectively are melted to bond the p-side electrode 26 of the semiconductor laser element 151 and the submount 14 to each other, whereby the low melting point metal layers 28a and 28b can embed a clearance resulting from the shape, comprising recess portions and projection portions, of the p-side electrode 26 formed on the surface of the semiconductor laser element 151. Thus, excellent heat radiation can be attained and bond strength can be improved. Therefore, the semiconductor laser element 151 can be stably mounted on the submount 14 with no inclination due to the improvement of the bond strength. Further, the low melting point metal layer 28a prepared from the soft material (Au—Sn 90%) can embed the ridge potion in the semiconductor laser element 151, thereby effectively relaxing stress applied to the ridge portion. Consequently, operating current and operating voltage can be prevented from increase resulting from stress, whereby a semiconductor laser device having excellent reliability can be formed.

Third Embodiment

A third embodiment of the present invention is applied to a semiconductor laser element 152 having a single ridge portion and a non-current injection region in the vicinity of a cavity end surface.

Figure 7:
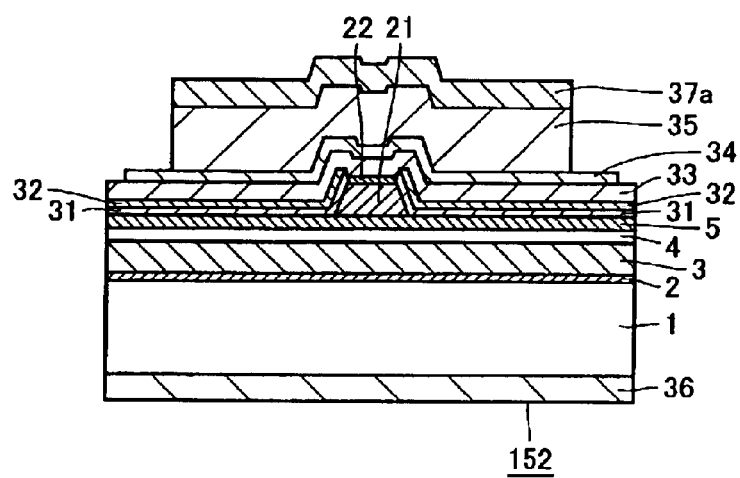
FIG. 7 is a sectional view showing a semiconductor laser element according to a third embodiment of the present invention in a direction perpendicular to a cavity.
Figure 8:
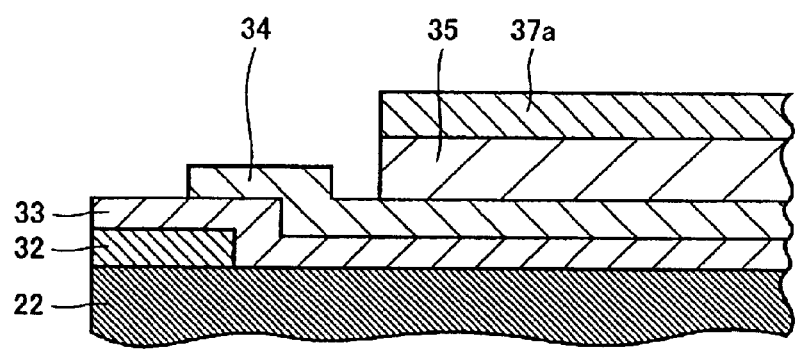
FIG. 8 is an enlarged view of a part of the semiconductor laser element shown in FIG. 7 close to a cavity end surface along a direction parallel to the cavity.

The structure of the semiconductor laser element 152 according to the third embodiment of the present invention is now described with reference to FIGS. 7 and 8. In the semiconductor laser element 152 according to the third embodiment, an n-type buffer layer 2, an n-type cladding layer 3, an MQW emission layer 4 and a p-type first cladding layer 5 are formed on an n-type GaAs substrate 1, similarly to the semiconductor laser element 150 according to the first embodiment shown in FIG. 1. The compositions and thicknesses of the layers 2 to 5 are similar to those of the layers 2 to 5 in the first embodiment.

A mesa (trapezoidal) ridge portion consisting of a p-type second cladding layer 21 of p-type AlGaInP having a thickness of about 1.2 μm and a p-type contact layer 22 of p-type GaInP having a thickness of about 0.1 μm is formed on the upper surface of the p-type first cladding layer 5. The ridge portion is formed to have a height of about 1.3 μm while the width of the bottom portion thereof is about 2.5 μm. An n-type optical confinement layer 31 of n-type AlInP having a thickness of about 0.3 μm is formed to cover the upper surface of the p-type first cladding layer 5 and the side surfaces of the ridge portion. An n-type current blocking layer 32 of n-type GaAs having a thickness of about 0.5 μm is formed to cover substantially the overall upper surface of the n-type optical confinement layer 31 and a region on the upper surface of the ridge portion close to the cavity end surface (the upper surface of the p-type contact layer 22). A part of the n-type current blocking layer 32 located on the upper surface of the ridge portion is formed to have a length of about 30 μm from the cavity end surface. Thus, a non-current injection region is formed under the region formed with the n-type current blocking layer 32 in the vicinity of the cavity end surface. The n-type optical confinement layer 31 and the n-type current blocking layer 32 are formed to protrude upward beyond the upper surface of the ridge portion in regions other than that close to the cavity end surface.

A p-type cap layer 33 of p-type GaAs having a thickness of about 3 μm is formed to cover the exposed upper surface of the ridge portion and the upper surface of the n-type current blocking layer 32. A p-side first electrode 34 consisting of a multilayer film of a Cr layer having a thickness of about 0.1 μm and an Au layer having a thickness of about 1 μm is formed on a prescribed region of the upper surface of the p-type cap layer 33. A p-side second electrode 35 consisting of a multilayer film of a Pd layer having a thickness of about 0.1 μm and an Au layer having a thickness of about 2 μm is formed on the region of the p-side first electrode 34 other than the non-current injection region. The p-side second electrode 35 is formed to have a shape comprising recess portions and projection portions reflecting the shapes of the n-type optical confinement layer 31 and the n-type current blocking layer 32 protruding upward beyond the upper surface of the ridge portion. The p-side second electrode 35 is also formed to have a shape comprising recess portions and projection portions reflecting the shape of the ridge portion. The p-side second electrode 35 is an example of the "first electrode layer" according to the present invention.

An n-side electrode 36 consisting of a multilayer film of an Au—Ge layer having a thickness of about 0.2 μm, an Ni layer having a thickness of about 0.01 μm and an Au layer having a thickness of about 0.5 μm is formed on the back surface of the n-type GaAs substrate 1.

A low melting point metal layer 37a consisting of an Au—Sn 20% layer having a thickness of about 0.3 μm and an Au—Sn 90% layer having a thickness of about 0.6 μm for serving as a fusing material is formed on the p-side second electrode 35. An Au film (not shown) having a thickness of about 0.01 μm is formed on the low melting point metal layer 37a for preventing oxidation. The low melting point metal layer 37a is an example of the "first low melting point metal layer" according to the present invention.

A process of forming the semiconductor laser element 152 according to the third embodiment is now described with reference to FIGS. 7 and 8. First, the n-type buffer layer 2 of n-type GaInP, the n-type cladding layer 3, the MQW emission layer 4 and the p-type first cladding layer 5 are formed on the n-type GaAs substrate 1 through a process similar to that of the first embodiment shown in FIG. 1. The compositions and thicknesses of the layers 2 to 5 are similar to those of the layers 2 to 5 in the first embodiment. Then, the p-type second cladding layer 21 of p-type AlGaInP having the thickness of about 1.2 μm and the p-type contact layer 22 of p-type GaInP having the thickness of about 0.1 μm are successively formed on the p-type first cladding layer 5. Thereafter the mesa (trapezoidal) ridge portion consisting of the p-type second cladding layer 21 and the p-type contact layer 22 is formed on the p-type first cladding layer 5 through a process similar to that of the second embodiment shown in FIG. 4. The ridge portion is formed to have the height of about 1.3 μm so that the width of the bottom portion thereof is about 2.5 μm.

Then, a mask layer (not shown) of SiO₂ formed on the ridge portion is employed as a mask for growing the n-type optical confinement layer 31 of n-type AlInP having the thickness of about 0.3 μm by MOVPE to cover the upper surface of the p-type first cladding layer 5 and the side surfaces of the ridge portion. Further, the n-type current blocking layer 32 of n-type GaAs having the thickness of about 0.5 μm is grown to cover substantially the overall upper surface of the n-type optical confinement layer 31 and the upper surface of the ridge portion (the upper surface of the p-type contact layer 22). A part of the n-type current blocking layer 32 located on the upper surface of the ridge portion is formed to have the length of about 30 μm from the cavity end surface. Thus, the non-current injection region is formed under the region formed with the n-type current blocking layer 32 in the vicinity of the cavity end surface. Thereafter the mask layer (not shown) of SiO₂ formed on the ridge portion is removed. In this case, the n-type optical confinement layer 31 and the n-type current blocking layer 32, formed also on the side surfaces of the mask layer (not shown) of SiO₂, protrude upward beyond the upper surface of the ridge portion after removal of the mask layer (not shown).

Thereafter the p-type cap layer 33 of p-type GaAs having the thickness of about 3 μm is formed by MOVPE to cover the exposed upper surface of the ridge portion and the upper surface of the n-type current blocking layer 32. Then, the p-side first electrode 34 consisting of the multilayer film of the Cr layer having the thickness of about 0.1 μm and the Au layer having the thickness of about 1 μm is formed on the p-type cap layer 33 by the lift off method. Thereafter the p-side second electrode 35 consisting of the multilayer film of the Pd layer having the thickness of about 0.1 μm and the Au layer having the thickness of about 2 μm is formed on the region of the p-side first electrode 34 other than the non-current injection region. The p-side second electrode 35 is formed to have the shape comprising recess portions and projection portions reflecting the shapes of the n-type optical confinement layer 31 and the n-type current blocking layer 32 protruding upward beyond the upper surface of the ridge portion.

The back surface of the n-type GaAs substrate 1 is etched so that the thickness of the n-type GaAs substrate 1 is about 100 μm, for thereafter forming the n-side electrode 36 consisting of the multilayer film of the Au—Ge layer having the thickness of about 0.2 μm, the Ni layer having the thickness of about 0.01 μm and the Au layer having the thickness of about 0.5 μm on the back surface of the n-type GaAs substrate 1 by vacuum deposition. Thereafter heat treatment is performed with inert gas at a temperature of about 430° C. for about 5 minutes, thereby attaining ohmic contact.

Thereafter the Au—Sn 20% layer having the thickness of about 0.3 μm and the Au—Sn 90% layer having the thickness of about 0.6 μm are deposited on the p-side second electrode 35 by the lift off method in the third embodiment, thereby forming the low melting point metal layer 37a consisting of Au—Sn 20% and Au—Sn 90% for serving as the fusing material. The Au film (not shown) melting point metal layer 37a for preventing oxidation.

A process of mounting the semiconductor laser element 152 according to the third embodiment on a submount 14 is now described with reference to FIGS. 9 and 10.

Figure 9:
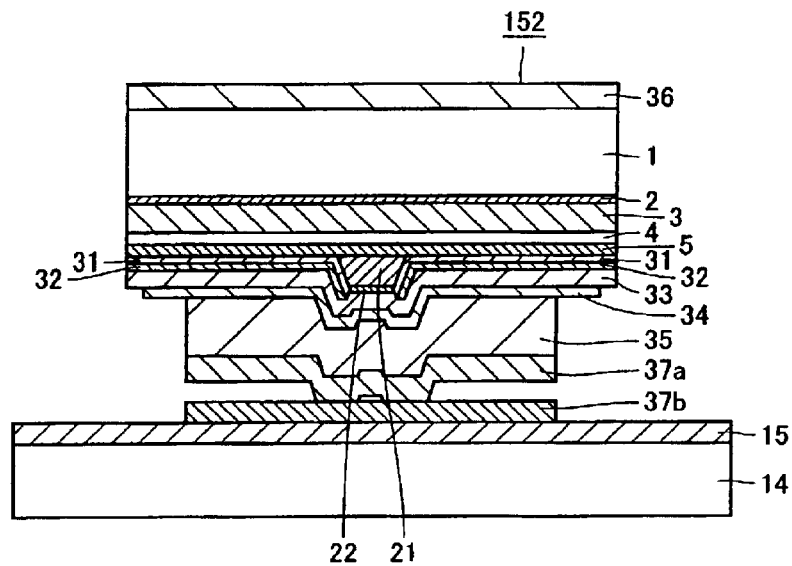
FIGS. 9 and 10 are sectional views for illustrating a process of mounting the semiconductor laser element shown in FIG. 7 on a submount (base) in the junction-down system.
Figure 10:
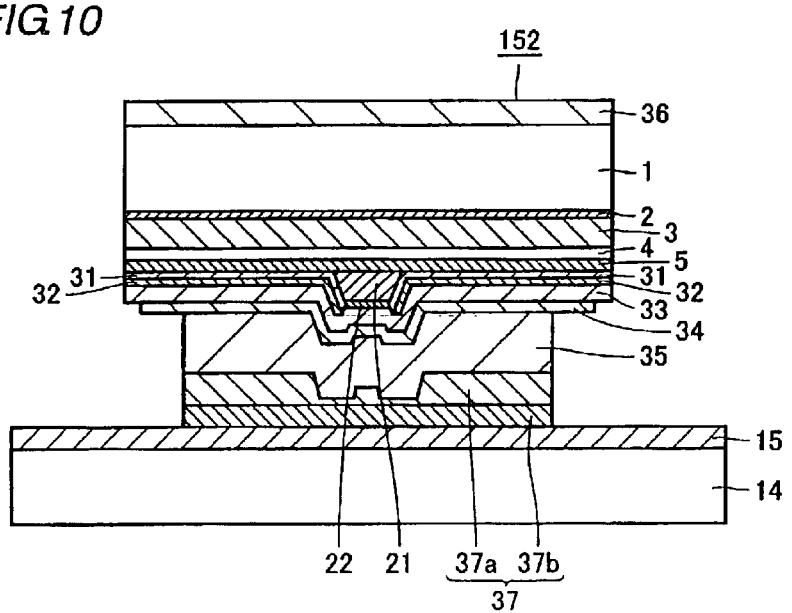

As shown in FIG. 9, a metal film 15 consisting of Ti, Pt and Au is formed on an aluminum nitride layer provided on the upper surface of the submount (base) 14, and a low melting point metal layer 37b of Pb—Sn 60% or Ag—Sn 95% for serving as a fusing material is previously formed on the metal film 15. The low melting point metal layer 37b is an example of the "second low melting point metal layer" according to the present invention.

The p-side second electrode 35 formed on the surface of the semiconductor laser element 152 is directed downward as shown in FIG. 9, for oppositely bringing the low melting point metal layers 37a and 37b of the semiconductor laser element 152 and the submount 14 into contact with each other. In this state, the low melting point metal layers 37a and 37b are heated to about 200° C. to about 300° C., to be melted. A low melting point metal layer 37 consisting of the melted low melting point metal layers 37a and 37b bonds (welds) the semiconductor laser element 152 to the submount 14, as shown in FIG. 10. In this case, the low melting point metal layer 37a embeds the shape, comprising recess portions and projection portions, of the p-side second electrode 35, so that the low melting point metal layer 37 (the low melting point metal layers 37a and 37b) embeds the space between the p-side second electrode 35 and the submount 14 with no clearance. Therefore, the semiconductor laser element 152 is mounted on the submount 14 in the junction-down system so that a projection portion of the p-side second electrode 35 and the metal film 15 formed on the submount 14 are not in contact with each other, for forming a semiconductor laser device according to the third embodiment.

Figure 23:
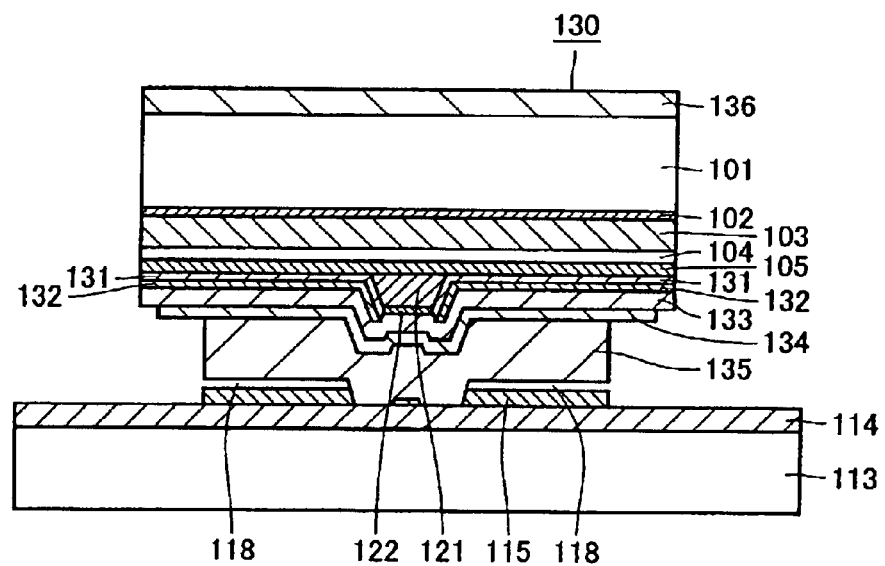
FIG. 23 is a sectional view of the semiconductor laser element according to the third prior art shown in FIG. 21 in a state mounted on a submount in the junction-down system.

Results of characteristic temperatures of the semiconductor laser device (see FIG. 10) according to the third embodiment of the present invention having the low melting point metal layer 37a on the p-side second electrode 35 and the conventional (comparative) semiconductor laser device (see FIG. 23) having no low melting point metal layer on the p-side second electrode 135 are now described.

Table 1 shows threshold currents (Ith) at 25° C. and 60° C., horizontal beam divergence (θh), vertical beam divergence (θv), lasing wavelengths (λp) and characteristic temperatures (To) in the semiconductor laser device according to the third embodiment and the conventional (comparative) semiconductor laser device. The characteristic temperatures (To) were obtained by comparing the threshold currents at 25° C. and 60° C. with each other.

TABLE 1

| Electrode Structure | Ith (60/25° C.) (mA) | θh (°), θh(°), λp (nm) | Characteristic Temperature To (K) |
|---|---|---|---|
| Third Embodiment | 53.3/36.8 | 8.8, 16.6, 660.4 | 94.5 |
| Conventional (Comparative) | 55.5/36.8 | 8.9, 16.7, 660.6 | 85.2 |

As shown in Table 1, the threshold currents (Ith), the horizontal beam divergence (θh), the vertical beam divergence (θv) and the lasing wavelengths (λp) were set substantially identical to each other in the semiconductor laser device according to the third embodiment and the conventional (comparative) semiconductor laser device. Under such conditions, the characteristic temperature of the conventional (comparative) semiconductor laser device was 85.2 K. On the other hand, the characteristic temperature of the semiconductor laser device according to the third embodiment was 94.5 K, i.e., higher by about 9 K than the characteristic temperature of the conventional (comparative) semiconductor laser device. Operation at a high temperature is improved as the value of the characteristic temperature is increased, and hence it has been proved that the semiconductor laser device according to the third embodiment has superior heat radiation as compared with the conventional (comparative) semiconductor laser device.

Results of reliability in high-temperature operation of the semiconductor laser device (see FIG. 10) according to the third embodiment and the conventional (comparative) semiconductor laser device (see FIG. 23) are now described.

Figure 11:
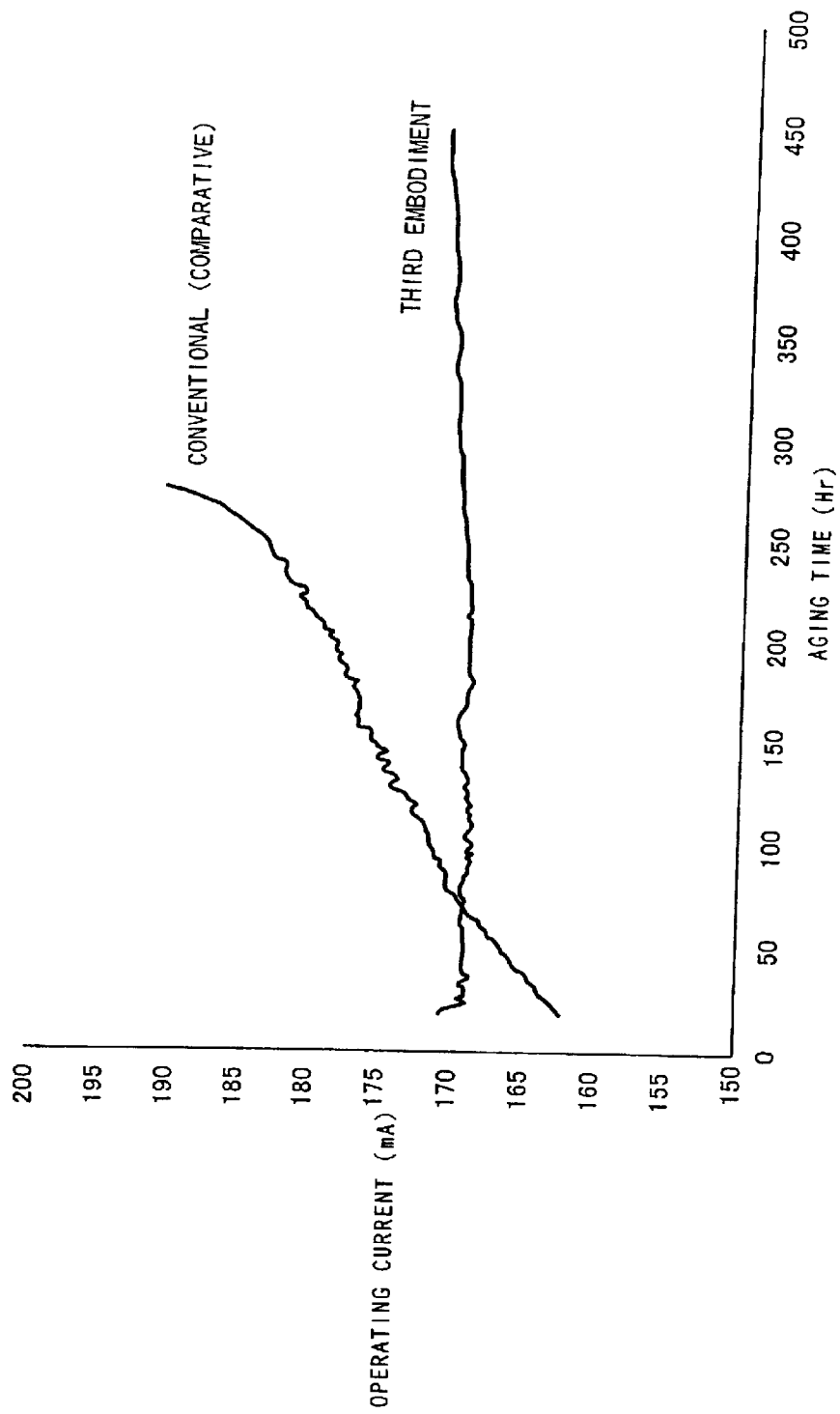
FIG. 11 is a characteristic diagram showing results of an aging test with pulsed operation on a semiconductor laser device according to the third embodiment of the present invention and a conventional (comparative) semiconductor laser device.

Referring to FIG. 11, aged deterioration values of operating current in an aging test with pulsed operation of the semiconductor laser device according to the third embodiment and the conventional (comparative) semiconductor laser device are compared with each other. Measurement conditions in the aging test with pulsed operation shown in FIG. 11 were set to an ambient temperature of 60° C., an operating pulse ratio (duty ratio) of 50% and a light output of 80 mW.

As shown in FIG. 11, it has been proved that the operating current increases with time in the conventional (comparative) semiconductor laser device. It has also been proved that the operating current hardly increases in the semiconductor laser device according to the third embodiment of the present invention, regardless of the lapse of time. Thus, it has been proved that the semiconductor laser device according to the third embodiment is more improved in reliability of high-temperature operation as compared with the conventional (comparative) semiconductor laser device. In other words, it has been proved that the semiconductor laser device according to the third embodiment has superior heat radiation and is more improved in reliability as compared with the conventional (comparative) semiconductor laser device.

According to the third embodiment, as hereinabove described, the low melting point metal layers 37a and 37b formed on the p-side second electrode 35 and the submount 14 respectively are melted to bond the p-side second electrode 35 of the semiconductor laser element 152 and the submount 14 to each other, whereby the low melting point metal layers 37a and 37b can embed a clearance resulting from the shape, comprising recess portions and projection portions, of the p-side second electrode 35 formed on the surface of the semiconductor laser element 152. Thus, excellent heat radiation can be attained and bond strength can be improved. Therefore, the semiconductor laser element 152 can be stably mounted on the submount 14 with no inclination due to the improvement of the bond strength. Further, the low melting point metal layer 37a prepared from the soft material (Au—Sn 90%) can embed the ridge potion in the semiconductor laser element 152, thereby effectively relaxing stress applied to the ridge portion. Consequently, operating current and operating voltage can be prevented from increase resulting from stress, whereby a semiconductor laser device having excellent reliability can be formed.

Fourth Embodiment

In a fourth embodiment of the present invention, a structure obtained by providing a low melting point metal layer on a p-side electrode of a semiconductor laser element 153 is applied to a nitride-based semiconductor laser device. The fourth embodiment is now described in detail with reference to FIGS. 12 and 13.

In the semiconductor laser element 153 according to the fourth embodiment, an n-type contact layer 42 of n-type GaN having a thickness of about 4 μm, an n-type cladding layer 43 of n-type AlGaN having a thickness of about 1 μm and an MQW emission layer 44 are formed on a sapphire substrate 41. The MQW emission layer 44 is formed by alternately stacking three quantum well layers of $In_xGa_{1-x}N$ each having a thickness of about 8 nm and four quantum barrier layers of $In_yGa_{1-y}N$ each having a thickness of about 16 nm, where x>y, x=0.13 and y=0.05 in the fourth embodiment. The MQW emission layer 44 is an example of the "emission layer" according to the present invention.

A p-type cladding layer 45 of $Al_vGa_{1-v}N$ (v=0.08) having a projection portion of about 1.5 μm in width is formed on the MQW emission layer 44. The thickness of the projection portion of the p-type cladding layer 45 is about 0.4 μm, and the thickness of the remaining region of the p-type cladding layer 45 excluding the projection portion is about 0.1 μm. A p-type contact layer 46 of p-type GaN having a thickness of about 0.07 μm is formed on the upper surface of the projection portion of the p-type cladding layer 45. The projection portion of the p-type cladding layer 45 and the p-type contact layer 46 form a ridge portion. A p-side ohmic electrode 47 consisting of a Pt layer having a thickness of about 1 nm and a Pd layer having a thickness of about 3 nm is formed on the upper surface of the p-type contact layer 46.

Partial regions of the layers from the p-type cladding layer 45 to the n-type contact layer 42 are removed for exposing the upper surface of the n-type contact layer 42. A current blocking layer 48 of $SiO_2$ having a thickness of about 0.2 μm is formed to cover the side surfaces of the ridge portion and the p-side ohmic electrode 47 formed on the ridge portion, the flat portion of the p-type cladding layer 45, the side surfaces of the MQW emission layer 44, the n-type cladding layer 43 and the n-type contact layer 42 exposed by etching and a partial region of the upper surface of the n-type contact layer 42.

A p-side pad electrode 49 consisting of an Ni layer having a thickness of about 0.1 μm and an Au layer having a thickness of about 3 μm is formed on a partial region of the current blocking layer 48, to cover the p-side ohmic electrode 47. The p-side pad electrode 49 is formed to have a shape comprising recess portions and projection portions reflecting the shape of the ridge portion and a fine shape comprising recess portions and projection portions (not shown) reflecting the shape of the current blocking layer 48.

An n-side ohmic electrode 50 consisting of a Ti layer having a thickness of about 10 nm and an Al layer having a thickness of about 0.1 μm is formed on the exposed surface of the n-type contact layer 42. An n-side pad electrode 51 consisting of an Ni layer having a thickness of about 0.1 μm and an Au layer having a thickness of about 3 μm is formed on a partial region of the upper surface of the n-side ohmic electrode 50. The p-side pad electrode 49 is an example of the "first electrode layer" according to the present invention, and the n-side pad electrode 51 is an example of the "second electrode layer" according to the present invention.

In the semiconductor laser element 153 according to the fourth embodiment, a low melting point metal layer 52a of Sn having a thickness of about 1 μm is formed on the p-side pad electrode 49. An Au film (not shown) having a thickness of about 0.01 μm is formed on the low melting point metal layer 52a for preventing oxidation. Another low melting point metal layer 53a of Sn having a thickness of about 1 μm is formed on the n-side pad electrode 51. An Au film (not shown) having a thickness of about 0.01 μm is formed on the low melting point metal layer 53a for preventing oxidation. The low melting point metal layers 52a and 53a are examples of the "first low melting point metal layer" according to the present invention.

Figure 12:
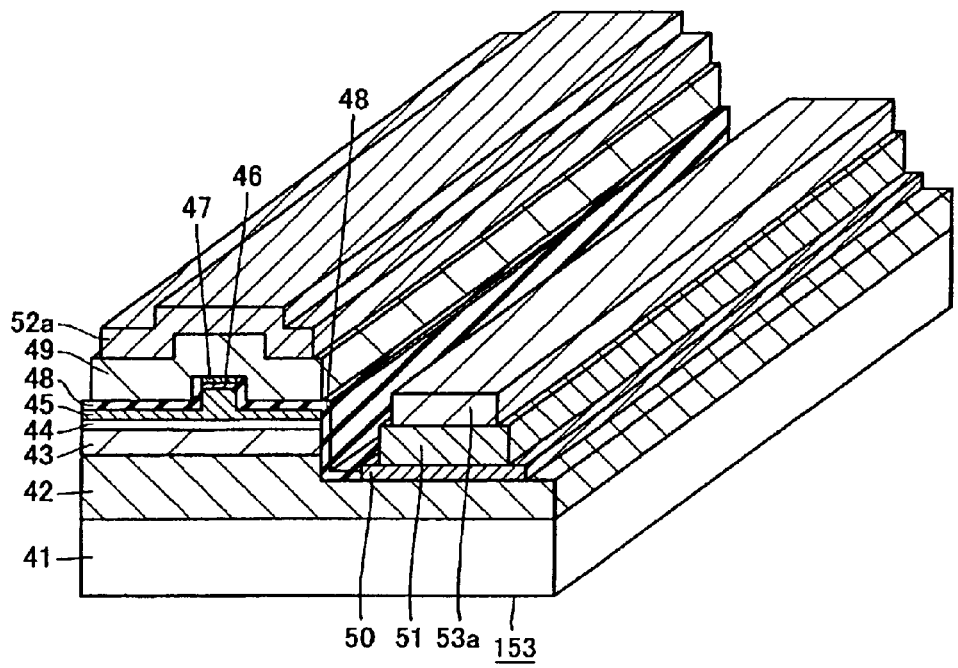
FIG. 12 is a perspective view showing a semiconductor laser element according to a fourth embodiment of the present invention.
Figure 13:
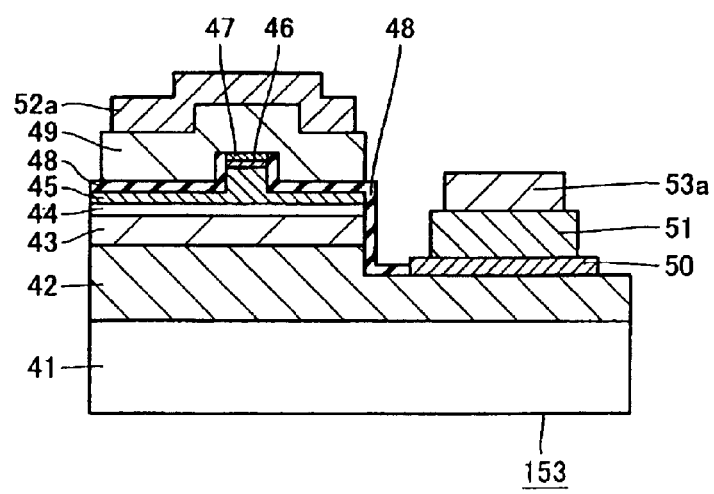
FIG. 13 is a sectional view of the semiconductor laser element shown in FIG. 12 in a direction perpendicular to a cavity.

In a process of forming the aforementioned semiconductor layer element 153 according to the fourth embodiment, the semiconductor layers 42 to 46 are formed by MOVPE, and the current blocking layer 48 is formed by plasma CVD, for example. Si is employed as an n-type dopant in crystal growth, while Mg is employed as a p-type dopant. The electrodes 47 and 49 to 51 are formed by vacuum deposition, for example, followed by formation of the low melting point metal layers 52a and 53a. The semiconductor laser element 153 according to the fourth embodiment shown in FIGS. 12 and 13 is formed in this manner.

A process of mounting the semiconductor laser element 153 according to the fourth embodiment on a submount 54 is now described with reference to FIG. 14.

Figure 14:
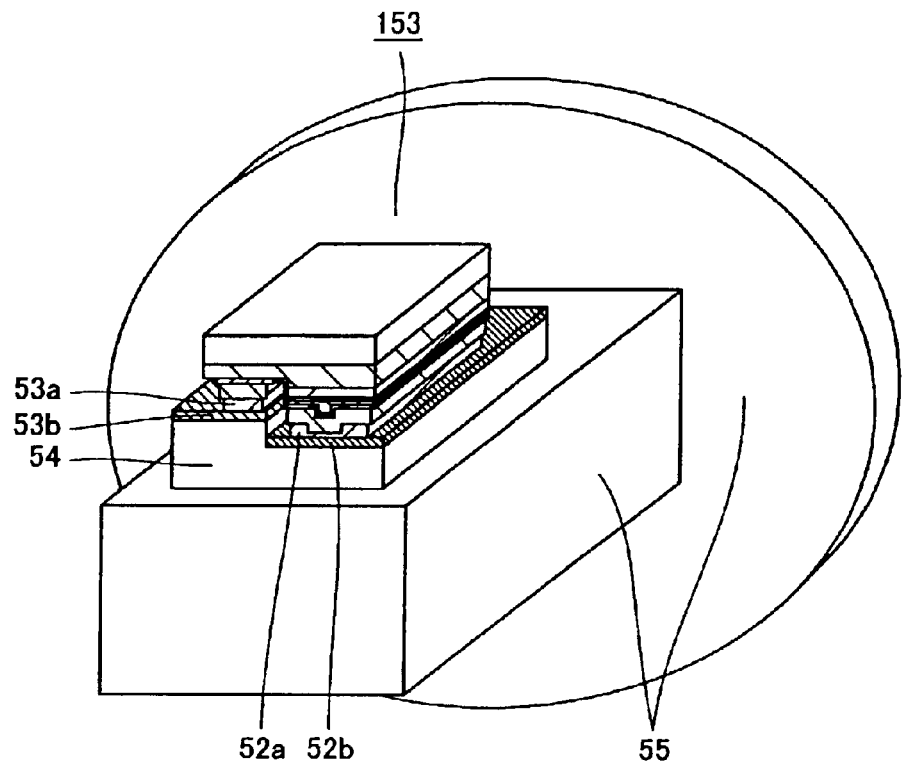
FIG. 14 is a perspective view for illustrating a process of mounting the semiconductor laser element shown in FIG. 12 on a submount (base) in the junction-down system.

As shown in FIG. 14, a low melting point metal layer 52b of Ag—Sn 96.5% having a thickness of about 4 μm for serving as a fusing material is previously formed on a region, coming into contact with the low melting point metal layer 52a, of the upper surface of the submount (base) 54 consisting of aluminum nitride mounted on a stem 55. Another low melting point metal layer 53b of Ag—Sn 96.5% having a thickness of about 4 μm for serving as a fusing material is previously formed on a region of the upper surface of the submount 54 coming into contact with the low melting point metal layer 53a. The low melting point metal layers 52b and 53b are examples of the "second low melting point metal layer" according to the present invention.

The p-side pad electrode 49 and the n-side pad electrode 51 formed on the surface of the semiconductor laser element 153 are directed downward for oppositely bringing the low melting point metal layers 52a and 53a of the semiconductor laser element 153 and the low melting point metal layers 52b and 53b of the submount 54 into contact with each other. In this state, the low melting point metal layers 52a, 53a, 52b and 53b are heated to about 250° C. to be melted, so that the low melting point metal layers 52a, 53a, 52b and 53b are flattened due to shape change. Further, elements (Sn, Ag and Au) forming the low melting point metal layers 52a, 53a, 52b and 53b mutually diffuse so that concentrations may be modulated on the interfaces between the elements depending on the contents, the fusion rates and the temperature reduction rates of the elements. Thus, the semiconductor laser element 153 is bonded (welded) to the submount 54. In this case, the low melting point metal layer 52a embeds the shape, comprising recess portions and projection portions, of the p-side pad electrode 49, so that the low melting point metal layers 52a and 52b embed the space between the p-side pad electrode 49 and the submount 54 with no clearance.

According to the fourth embodiment, the low melting point metal layers 52a and 52b formed on the p-side pad electrode 49 and the submount 54 respectively are melted to bond the p-side pad electrode 49 of the semiconductor laser element 153 and the submount 54 to each other, whereby the low melting point metal layers 52a and 52b can embed a clearance resulting from the shape, comprising recess portions and projection portions, of the p-side pad electrode 49 formed on the surface of the semiconductor laser element 153. Thus, excellent heat radiation can be attained and bond strength can be improved. Further, the low melting point metal layers 52a and 52b prepared from the soft materials (Sn and Ag—Sn 96.5%) can embed the ridge potion in the semiconductor laser element 153, thereby effectively relaxing stress applied to the ridge portion. Consequently, oper-

Fifth Embodiment

In a fifth embodiment of the present invention, an n-type GaN substrate 61 having conductivity is employed in place of the sapphire substrate 41 in the fourth embodiment. The fifth embodiment is now described in detail with reference to FIG. 15.

In a semiconductor laser element 154 according to the fifth embodiment, an n-type contact layer 62 of n-type GaN having a thickness of about 4 μm, an n-type cladding layer 63 of n-type AlGaN having a thickness of about 1 μm and an MQW emission layer 64 similar in composition to the MQW emission layer 44 according to the fourth embodiment are formed on the n-type GaN substrate 61 having conductivity. The MQW emission layer 64 is an example of the "emission layer" according to the present invention.

A p-type cladding layer 65 of $Al_vGa_{1-v}N$ (v=0.08) having a projection portion of about 1.5 μm in width is formed on the MQW emission layer 64. The thickness of the projection portion of the p-type cladding layer 65 is about 0.4 μm, and the thickness of the remaining region of the p-type cladding layer 65 excluding the projection portion is about 0.1 μm. A p-type contact layer 66 of p-type GaN having a thickness of about 0.07 μm is formed on the upper surface of the projection portion of the p-type cladding layer 65. The projection portion of the p-type cladding layer 65 and the p-type contact layer 66 form a ridge portion. A p-side ohmic electrode 67 consisting of a Pt layer having a thickness of about 1 nm and a Pd layer having a thickness of about 3 nm is formed on the upper surface of the p-type contact layer 66.

A current blocking layer 68 of $SiO_2$ having a thickness of about 0.2 μm is formed to cover the side surfaces of the ridge portion and the p-side ohmic electrode 67 formed on the ridge portion and the flat portion of the p-type cladding layer 65.

A p-side pad electrode 69 consisting of an Ni layer having a thickness of about 0.1 μm and an Au layer having a thickness of about 3 μm is formed on a partial region of the current blocking layer 68, to cover the p-side ohmic electrode 67. The p-side pad electrode 69 is formed to have a shape comprising recess portions and projection portions reflecting the shape of the ridge portion and a fine shape comprising recess portions and projection portions (not shown) reflecting the shape of the current blocking layer 68.

An n-side ohmic electrode 70 consisting of a Ti layer having a thickness of about 10 nm and an Al layer having a thickness of about 0.1 μm is formed on the back surface of the n-type GaN substrate 61. An n-side pad electrode 71 consisting of an Ni layer having a thickness of about 0.1 μm and an Au layer having a thickness of about 3 μm is formed on the back surface of the n-side ohmic electrode 70. The p-side pad electrode 69 is an example of the "first electrode layer" according to the present invention.

In the semiconductor laser element 154 according to the fifth embodiment, a low melting point metal layer 72a of Sn having a thickness of about 1 μm is formed on the p-side pad electrode 69. An Au film (not shown) having a thickness of about 0.01 μm is formed on the low melting point metal layer 72a for preventing oxidation. The low melting point metal layer 72a is an example of the "first low melting point metal layer" according to the present invention.

Figure 15:
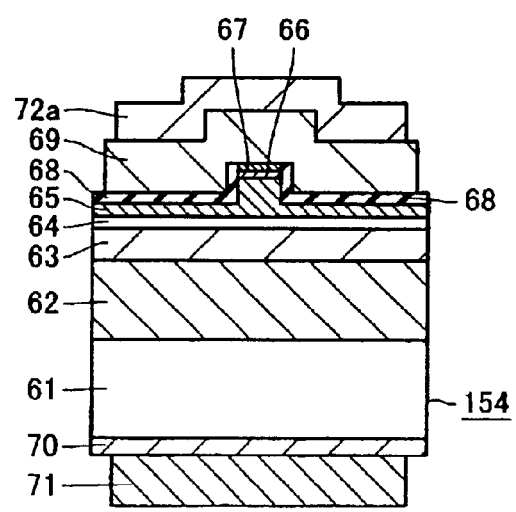
FIG. 15 is a sectional view showing a semiconductor laser element according to a fifth embodiment of the present invention in a direction perpendicular to a cavity.

In a process of forming the aforementioned semiconductor layer element 154 according to the fifth embodiment, the semiconductor layers 62 to 66 are formed by MOVPE, and the current blocking layer 68 is formed by plasma CVD, for example. Si is employed as an n-type dopant in crystal growth, while Mg is employed as a p-type dopant. The electrodes 67 and 69 to 71 are formed by vacuum deposition, for example, followed by formation of the low melting point metal layer 72a. The semiconductor laser element 154 according to the fifth embodiment shown in FIG. 15 is formed in this manner.

A process of mounting the semiconductor laser element 154 according to the fourth embodiment on a submount 73 is now described with reference to FIG. 16.

Figure 16:
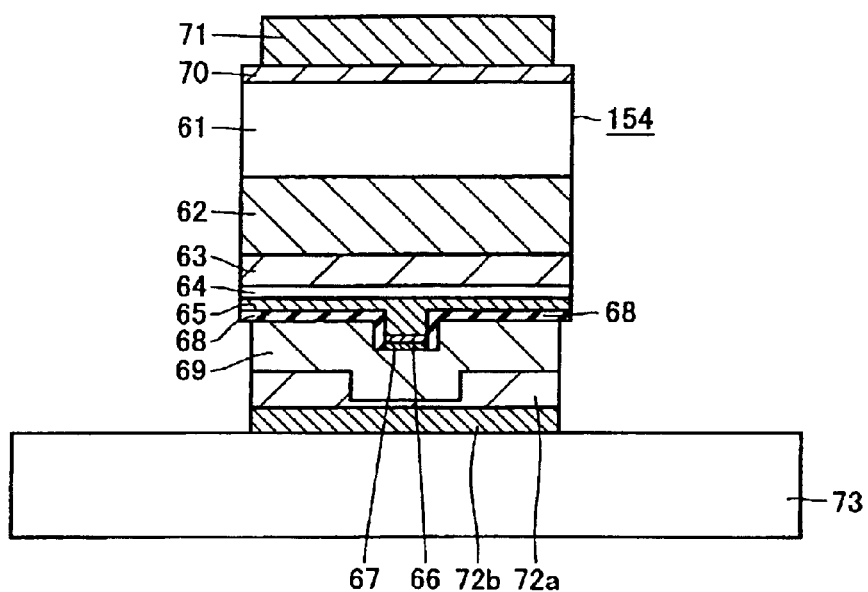
FIG. 16 is a sectional view for illustrating a process of mounting the semiconductor laser element shown in FIG. 15 on a submount (base) in the junction-down system.
Figure 17:
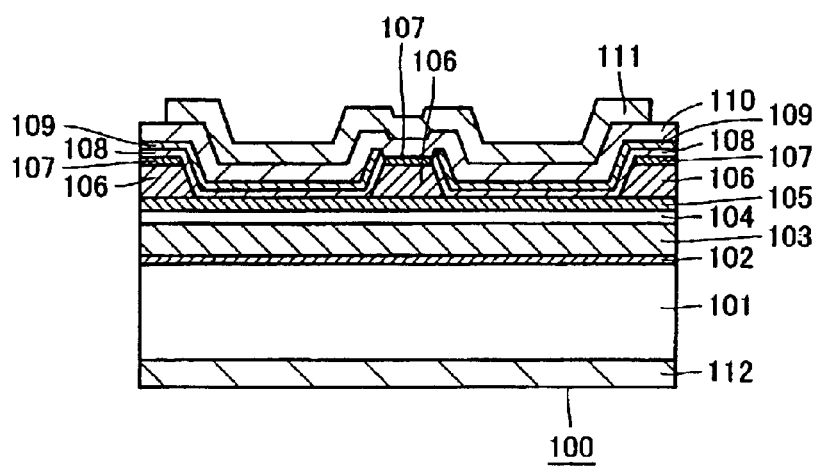
FIG. 17 is a sectional view showing a semiconductor laser element according to first prior art in a direction perpendicular to a cavity.
Figure 18:
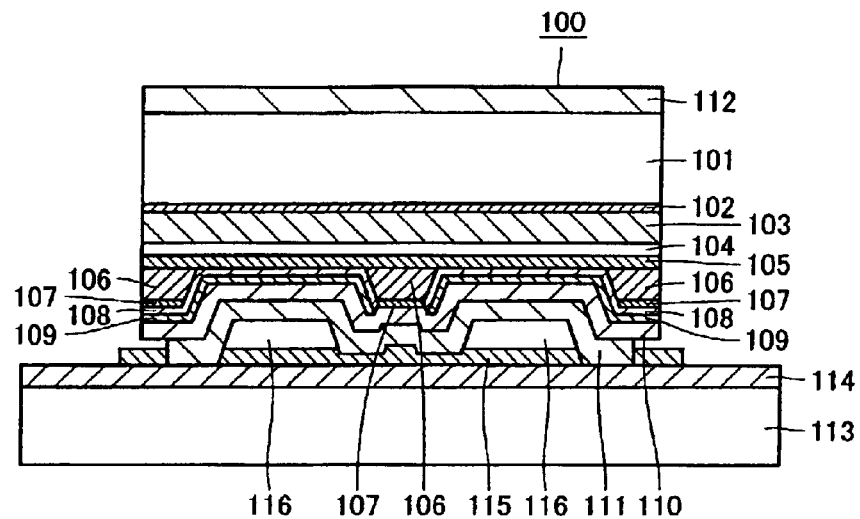
FIG. 18 is a sectional view of the semiconductor laser element according to the first prior art shown in FIG. 17 in a state mounted on a submount in the junction-down system.
Figure 19:
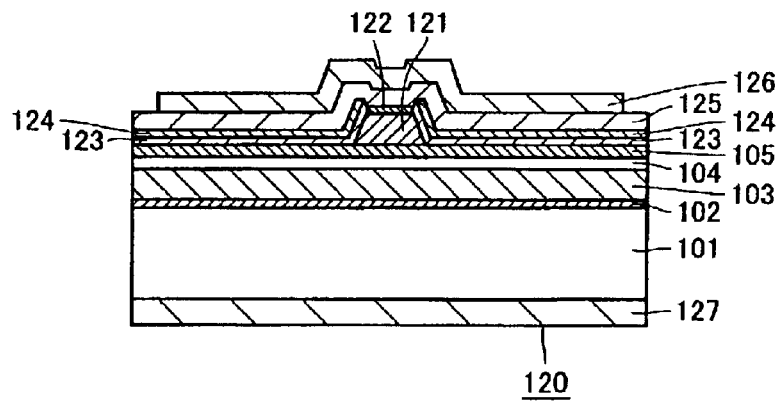
FIG. 19 is a sectional view showing a semiconductor laser element according to second prior art in a direction perpendicular to a cavity.
Figure 20:
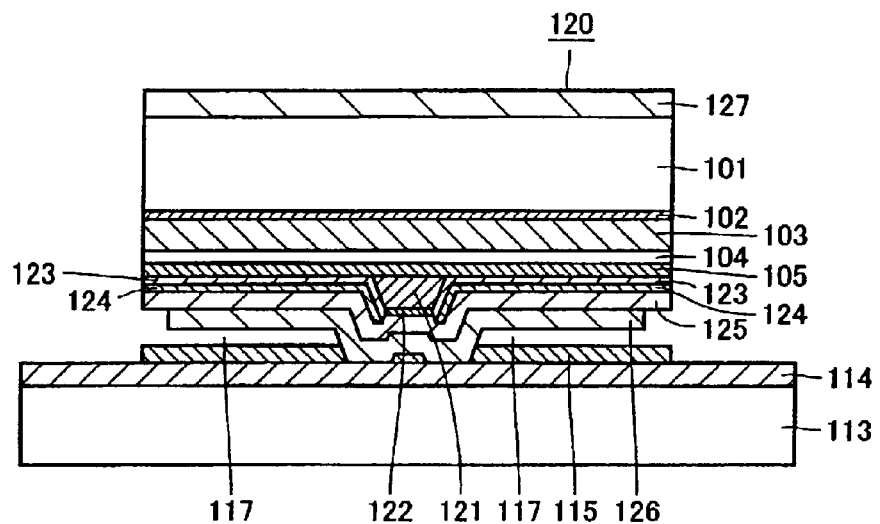
FIG. 20 is a sectional view of the semiconductor laser element according to the second prior art shown in FIG. 19 in a state mounted on a submount in the junction-down system.
Figure 21:
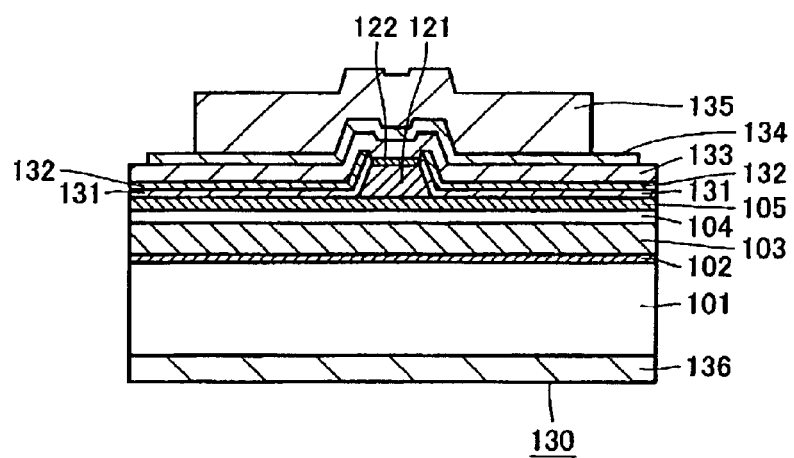
FIG. 21 is a sectional view showing a semiconductor laser element according to third prior art in a direction perpendicular to a cavity.
Figure 22:
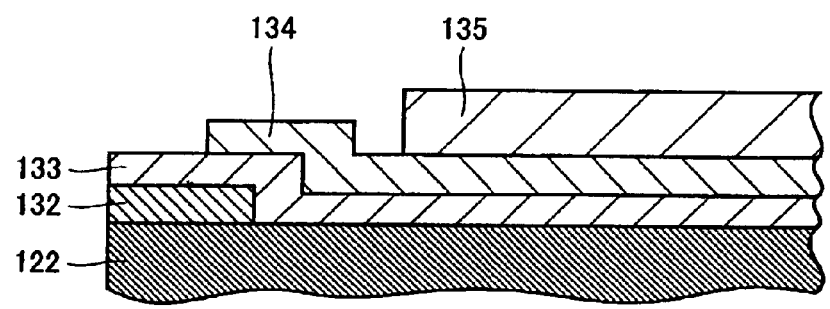
FIG. 22 is an enlarged view showing a part of the semiconductor laser element according to the third prior art shown in FIG. 21 close to a cavity end surface along a direction parallel to the cavity.

As shown in FIG. 16, a low melting point metal layer 72b of Ag—Sn 96.5% having a thickness of about 4 μm for serving as a fusing material is previously formed on the upper surface of the submount (base) 73 consisting of aluminum nitride mounted on a stem (not shown). The low melting point metal layer 72b is an example of the "second low melting point metal layer" according to the present invention.

The p-side pad electrode 69 formed on the surface of the semiconductor laser element 154 is directed downward for oppositely bringing the low melting point metal layers 72a and 72b of the semiconductor laser element 154 and the submount 73 into contact with each other. In this state, the low melting point metal layers 72a and 72b are heated to about 250° C. to be melted, so that the low melting point metal layers 72a and 72b are flattened due to shape change. Further, elements (Sn, Ag and Au) forming the low melting point metal layers 72a and 72b mutually diffuse so that concentrations may be modulated on the interfaces between the elements depending on the contents, the fusion rates and the temperature reduction rates of the elements. Thus, the semiconductor laser element 154 is bonded to the submount 73, as shown in FIG. 16. In this case, the low melting point metal layer 72a embeds the shape, comprising recess portions and projection portions, of the p-side pad electrode 69, so that the low melting point metal layers 72a and 72b embed the space between the p-side pad electrode 69 and the submount 73 with no clearance.

According to the fifth embodiment, the low melting point metal layers 72a and 72b formed on the p-side pad electrode 69 and the submount 73 respectively are melted as hereinabove described to bond the p-side pad electrode 69 of the semiconductor laser element 154 and the submount 73 to each other, whereby the low melting point metal layers 72a and 72b can embed a clearance resulting from the shape, comprising recess portions and projection portions, of the p-side pad electrode 69 formed on the surface of the semiconductor laser element 154. Thus, excellent heat radiation can be attained and bond strength can be improved. Further, the low melting point metal layers 72a and 72b prepared from the soft materials (Sn and Ag—Sn 96.5%) can embed the ridge potion in the semiconductor laser element 154, thereby effectively relaxing stress applied to the ridge portion. Consequently, operating current and operating voltage can be prevented from increase resulting from stress, whereby a semiconductor laser device having excellent reliability can be formed.

Although the present invention has been described and illustrated in detail, it is clearly understood that the same is by way of illustration and example only and is not to be taken by way of limitation, the spirit and scope of the present invention being limited only by the terms of the appended claims.

While the low melting point metal layer of Ag—Sn 96.5% is formed on the submount in each of the aforementioned fourth and fifth embodiments, for example, the present invention is not restricted to this but a metal film of Au having a thickness of about 0.01 μm may be formed on the low melting point metal layer of Ag—Sn 96.5%, for preventing oxidation of Ag—Sn.

What is claimed is:

1. A semiconductor laser device comprising:
    a semiconductor element including an emission layer;
    a first electrode layer formed on the surface of said semiconductor element to have a shape comprising recess portions and projection portions;
    a base mounted with said semiconductor element; and
    a plurality of low melting point metal layers provided between said first electrode layer formed on the surface of said semiconductor element and said base for bonding said first electrode layer formed on the surface of said semiconductor element and said base to each other, wherein
    said plurality of low melting point metal layers are formed to bond said first electrode layer formed on the surface of said semiconductor element and said base to each other while embedding said shape comprising recess portions and projection portions.

2. The semiconductor laser device according to claim 1, wherein
    said plurality of low melting point metal layers have a thickness exceeding the height of the projection portions of said shape comprising recess portions and projection portions.

3. The semiconductor laser device according to claim 1, wherein
    said low melting point metal layers include:
        a first low melting point metal layer provided on said first electrode layer formed on said semiconductor element, and
        a second low melting point metal layer provided on said base.

4. The semiconductor laser device according to claim 3, wherein
    said first low melting point metal layer includes at least either an Sn layer or an Au—Sn layer, and
    said second low melting point metal layer includes at least any of a Pb—Sn layer, an Ag—Sn layer and an Au—Sn layer.

5. The semiconductor laser device according to claim 3, wherein
    said first low melting point metal layer includes a multi-layer film having a plurality of Au—Sn layers of different Au—Sn compositions.

6. The semiconductor laser device according to claim 1, wherein
    said first electrode layer includes a first electrode layer provided on the surface of said semiconductor element,
    a second electrode layer is further provided on the surface of said semiconductor element, and
    said low melting point metal layers bond said first electrode layer and said second electrode layer to said base.

7. The semiconductor laser device according to claim 1, wherein
    said semiconductor element including said emission layer is formed on a first conductivity type GaN substrate.

8. The semiconductor laser device according to claim 1, wherein
    the surface of said semiconductor element closer to said emission layer is mounted on said base.

9. A semiconductor laser device comprising:
    a semiconductor layer including an emission layer;
    a first electrode layer formed on the surface of said semiconductor element to have a shape comprising recess portions and projection portions;
    a base mounted with said semiconductor element; and
    a low melting point metal layer provided between said first electrode layer formed on the surface of said semiconductor element and said base and formed on a portion for bonding said first electrode layer formed on the surface of said semiconductor element and said base to each other to embed said shape comprising recess portions and projection portions.

10. The semiconductor laser device according to claim 9, wherein
    said low melting point metal layer includes:
        a first low melting point metal layer provided on said first electrode layer formed on said semiconductor element, and
        a second low melting point metal layer provided on said base.

11. The semiconductor laser device according to claim 10, wherein
    said first low melting point metal layer includes at least either an Sn layer or an Au—Sn layer, and
    said second low melting point metal layer includes at least any of a Pb—Sn layer, an Ag—Sn layer and an Au—Sn layer.

12. The semiconductor laser device according to claim 10, wherein
    said first low melting point metal layer includes a multi-layer film having a plurality of Au—Sn layers of different Au—Sn compositions.

13. The semiconductor laser device according to claim 9, wherein
    said first electrode layer includes a first electrode layer provided on the surface of said semiconductor element,
    a second electrode layer is further provided on the surface of said semiconductor element, and
    said low melting point metal layer bonds said first electrode layer and said second electrode layer to said base.

14. The semiconductor laser device according to claim 9, wherein
    said semiconductor element including said emission layer is formed on a first conductivity type GaN substrate.

15. The semiconductor laser device according to claim 9, wherein
    the surface of said semiconductor element closer to said emission layer is mounted on said base.

16. A semiconductor laser device comprising:
    a semiconductor layer including an emission layer,
    a first electrode layer formed on the surface of said semiconductor element to have a shape comprising recess portions and projection portions;
    a base mounted with said semiconductor element; and
    a plurality of low melting point metal layers provided between said first electrode layer formed on the surface of said semiconductor element and said base for bonding said first electrode layer formed on the surface of said semiconductor element and said base to each other,
    said low melting point metal layers including a first low melting point metal layer provided on said first electrode layer formed on the surface of said semiconductor element and a second low melting point metal layer provided on said base.

* * * * *